US012745403B2

(12) United States Patent
Lin et al.

(10) Patent No.: US 12,745,403 B2
(45) Date of Patent: Sep. 22, 2026

(54) FERROELECTRIC OXIDE- AND FERROELECTRIC MONOCHALCOGENIDE-BASED CAPACITORS

(71) Applicant: Intel Corporation, Santa Clara, CA (US)

(72) Inventors: Chia-Ching Lin, Portland, OR (US); Tanay A. Gosavi, Portland, OR (US); Uygar E. Avci, Portland, OR (US); Sou-Chi Chang, Portland, OR (US); Hai Li, Portland, OR (US); Dmitri Evgenievich Nikonov, Beaverton, OR (US); Kaan Oguz, Portland, OR (US); Ashish Verma Penumatcha, Beaverton, OR (US); John J. Plombon, Portland, OR (US); Ian Alexander Young, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 477 days.

(21) Appl. No.: 17/555,207

(22) Filed: Dec. 17, 2021

(65) Prior Publication Data

US 2023/0200079 A1 Jun. 22, 2023

(51) Int. Cl.

*H10B 53/20* (2023.01)
*H10D 1/68* (2025.01)
*H10D 64/68* (2025.01)

(52) U.S. Cl.

CPC ............. *H10B 53/20* (2023.02); *H10D 1/694* (2025.01); *H10D 64/689* (2025.01)

(58) Field of Classification Search

CPC ...... H10B 53/20; H10B 12/033; H10B 12/31; H10D 1/694; H10D 64/689; H10D 1/696;

(Continued)

(56) References Cited

U.S. PATENT DOCUMENTS

| | | |
|---|---|---|
| 6,344,413 B1 | 2/2002 | Zurcher et al. |
| 2002/0052101 A1 | 5/2002 | Yang |

(Continued)

FOREIGN PATENT DOCUMENTS

| | | |
|---|---|---|
| WO | 2002019389 A2 | 3/2002 |

OTHER PUBLICATIONS

Liying Zhu, Yan Lu, Li Wang; Tuning ferroelectricity by charge doping in two-dimensional SnSe. J. Appl. Phys. Jan. 7, 2020; 127(1): 014101 (Year: 2020).*

(Continued)

*Primary Examiner* — Allison Bernstein
(74) *Attorney, Agent, or Firm* — Alliance IP, LLC

(57) ABSTRACT

A first type of ferroelectric capacitor comprises electrodes and an insulating layer comprising ferroelectric oxides. In some embodiments, the electrodes and the insulating layer comprise perovskite ferroelectric oxides. A second type of ferroelectric capacitor comprises a ferroelectric insulating layer comprising certain monochalcogenides. Both types of ferroelectric capacitors can have a coercive voltage that is less than one volt. Such capacitors are attractive for use in low-voltage non-volatile embedded memories for next-generation semiconductor manufacturing technologies.

25 Claims, 10 Drawing Sheets

(58) Field of Classification Search
CPC .......... H10D 1/682; H10D 1/68; H10D 1/692; H10D 1/716; H01L 23/642; H01G 7/06; H10W 44/601
See application file for complete search history.

(56) References Cited

U.S. PATENT DOCUMENTS

| | | | | |
|---|---|---|---|---|
| 2020/0303344 | A1* | 9/2020 | Manipatruni | G11C 11/225 |
| 2021/0202510 | A1* | 7/2021 | Thareja | H10D 1/684 |
| 2021/0202689 | A1 | 7/2021 | Thareja et al. | |

OTHER PUBLICATIONS

EPO European Extended Search Report in EP Application Serial No. 22204035.4 mailed on May 23, 2023, 9 pages.

* cited by examiner 820
826
808
816
814
822
824
814
818

866
866
808
816
814
862
868
860
864
864
814
818

800
802
806
816
814
804
808
814
818

840
842
846
808
816
814
848
844
814
818

FERROELECTRIC OXIDE- AND FERROELECTRIC MONOCHALCOGENIDE-BASED CAPACITORS

BACKGROUND

Metal-insulator-metal (MIM) capacitors can be embedded in the metallization stack of an integrated circuit component. MIM capacitors comprising a ferroelectric insulating layer can be utilized in memories.

DETAILED DESCRIPTION

Figure 1B:
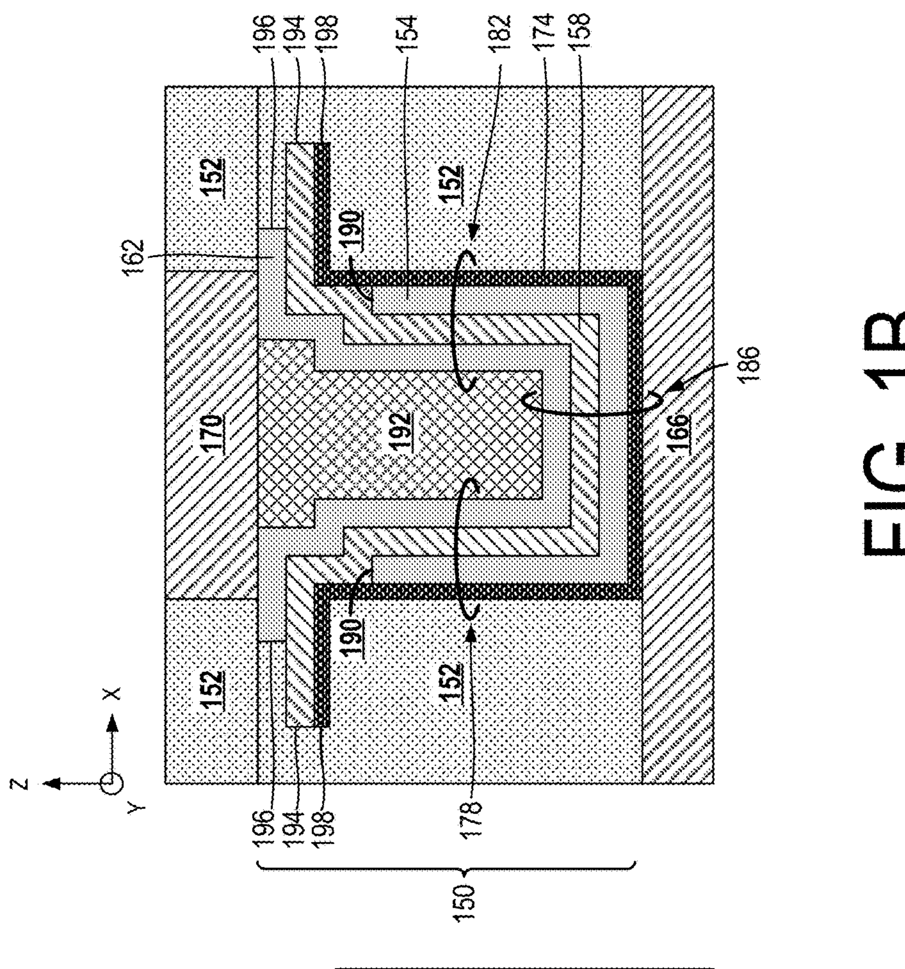
FIGS. 1A-1B illustrate example ferroelectric capacitors comprising ferroelectric oxides.

Described herein are capacitors that comprise an insulating layer comprising a ferroelectric material (ferroelectric capacitors). A ferroelectric material is a material that exhibits, over some range of temperatures, a spontaneous electric polarization, (displacement of positive and negative charges from their original position), that can be reversed or reoriented by the application of an electric field. Because the displacement of the charges in ferroelectric materials can be maintained for some time even in the absence of an electric field, such materials may be used to implement non-volatile memory cells. For example, if the logical state of a memory cell is represented by the orientation of the electric polarization of a ferroelectric material (e.g., the ferroelectric insulating layer of a ferroelectric capacitor), the orientation of the electric polarization of the ferroelectric material in a first direction can represent a first logical state of the memory cell and the orientation of the electric polarization of the ferroelectric material in a second direction that is reversed (or opposite) from the first direction can represent a second logical state of the memory cell. The ferroelectric capacitors described herein can be utilized in memories (ferroelectric memories), such as embedded DRAM (in which the ferroelectric capacitors are embedded in the metallization stack of an integrated circuit component) or other high density memories. The ferroelectric capacitors can also be used as capacitors in non-memory applications, such as in analog circuitry.

Ferroelectric memories comprising ferroelectric capacitors have the potential for adequate non-volatility, short programming time, low power consumption, high endurance, and high speed writing. In addition, ferroelectric memories comprising ferroelectric capacitors may be manufactured using processes that are compatible with existing complementary metal-oxide-semiconductor (CMOS) manufacturing technology. Thus, these types of memories have emerged as promising candidates for memories in next generation manufacturing processes.

The ferroelectric capacitors described herein are attractive candidates for low-voltage operation as they have a coercive voltage of less than one volt, which is less than the coercive voltage of other ferroelectric materials that have been investigated for use as the insulating layer in ferroelectric capacitors in ferroelectric memories, such as hafnium zirconium oxide (HZO). For example, experimental studies have demonstrated that the coercive voltage of ferroelectric capacitors with SnS as the ferroelectric insulating layer material is well below 1 V for insulating layer thicknesses of less than 45 nm and that the coercive voltage of ferroelectric capacitors with $BiTaO_3$ (BTO) as the ferroelectric insulating layer material is less than 0.5 V for insulating layer thicknesses of 12.5-100 nm. In contrast, ferroelectric capacitors with hafnium zirconium oxide (HZO) as the insulating layer material have a coercive voltage greater than one volt.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact and "coupled" may indicate elements that co-operate or interact, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, a layer that is substantially planar may have bumps, divots, or other features on a surface of the layer due to process manufacturing variations and/or imperfections, the portion of a first layer or feature that is substantially perpendicular to a second layer or feature can include a first layer or feature that is +/−20 degrees from a second layer or feature, a first surface that is substantially parallel to a second surface can include a first surface that is within several degrees of parallel from the second surface, a volume that is substantially filled by a via can comprise voids in the via, and a first edge that is substantially aligned with a second edge can be misaligned on the order of ones of nanometers.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact. That is, there is no layer or component between the stated adjacent layers or components. For example, a layer X that is adjacent to a layer Y refers to a layer that is in physical contact with layer Y.

Certain terminology may also be used herein for the purpose of reference only, and thus are not intended to be limiting. For example, terms such as "upper," "lower," "above," "below," "bottom," and "top" refer to directions in the Figures to which reference is made. Terms such as "front," "back," "rear," and "side" describe the orientation and/or location of portions of the component within a consistent but arbitrary frame of reference which is made clear by reference to the text and the associated Figures describing the component under discussion. Such terminology may include the words specifically mentioned above, derivatives thereof, and words of similar import.

As used herein, the term "integrated circuit component" refers to a packaged or unpacked integrated circuit product. A packaged integrated circuit component comprises one or more integrated circuit dies mounted on a package substrate with the integrated circuit dies and package substrate encapsulated in a casing material, such as a metal, plastic, glass, or ceramic. In one example, a packaged integrated circuit component contains one or more processor units mounted on a substrate with an exterior surface of the substrate comprising a solder ball grid array (BGA). In one example of an unpackaged integrated circuit component, a single monolithic integrated circuit die comprises solder bumps attached to contacts on the die. The solder bumps allow the die to be directly attached to a printed circuit board. An integrated circuit component can comprise one or more of any computing system component described or referenced herein or any other computing system component, such as a processor unit (e.g., system-on-a-chip (SoC), processor core, graphics processor unit (GPU), accelerator, chipset processor), I/O controller, memory, or network interface controller. An integrated circuit component can comprise one or more ferroelectric capacitors and ferroelectric capacitors can be utilized in processor units, memories, or any other component within an integrated circuit component.

Reference is now made to the drawings, which are not necessarily drawn to scale, wherein similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

Figure 1A:
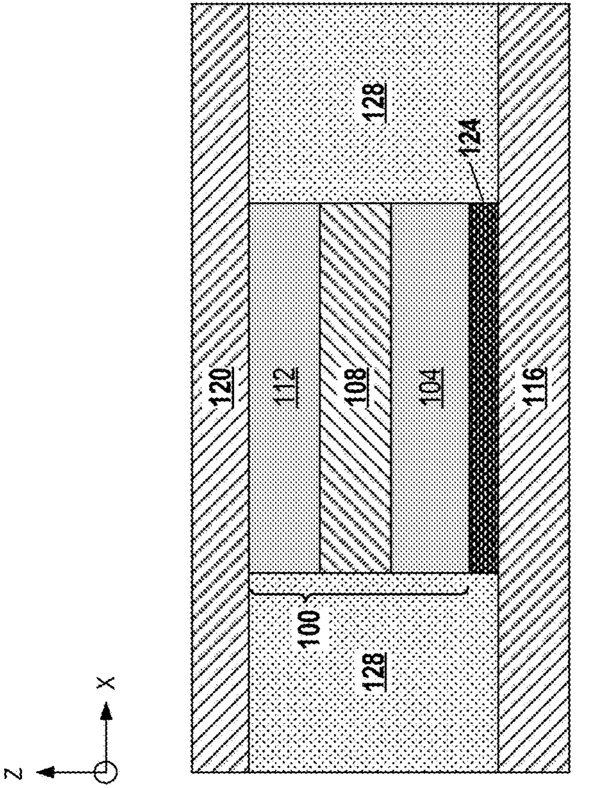

In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims FIGS. 1A-1B illustrate example ferroelectric capacitors comprising ferroelectric oxides. FIG. 1A illustrates an example planar ferroelectric capacitor 100 and FIG. 1B illustrates an example non-planar ferroelectric capacitor 150. The ferroelectric capacitor 100 comprises a ferroelectric insulating layer 108 positioned between a first electrode 104 and a second electrode 112. The ferroelectric insulating layer 108 and the electrodes 104 and 112 are substantially planar and substantially parallel to the other layers. The electrodes 104 and 112 and the ferroelectric insulating layer 108 comprise ferroelectric oxides.

The ferroelectric insulating layer 108 can comprise a perovskite ferroelectric oxide, such as barium titanate ($BaTiO_3$, also referred to as BTO, which is a material that comprises barium, titanium, and oxygen), bismuth ferrite ($BiFO_3$, also referred to as BFO, which is a material that comprises bismuth, iron, and oxygen), samarium-doped bismuth ferrite (Sm-doped $BiFO_3$, which is a material that comprises bismuth, iron, oxygen, and samarium), lanthanum-doped bismuth ferrite (La-doped $BiFO_3$, which is a material that comprises bismuth, iron, oxygen, and lanthanum), lithium tantalate ($LiTaO_3$, which is a material that comprises lithium, tantalum, and oxygen), lithium niobate ($LiNbO_3$, which is a material that comprises lithium, niobium, and oxygen), $PbZr_{(1-x)}Ti_xO_3$ (which is a material that comprises lead, zirconium, titanium, and oxygen), sodium tantalate ($NaTaO_3$, which is a material that comprises sodium, tantalum, and oxygen), strontium titanate ($SrTiO_3$, which is a material that comprises strontium, titanium, and oxygen), potassium tantalate ($KTaO_3$, which is a material that comprises potassium, tantalum, and oxygen), or $Ba_{(x)}Sr_{(1-x)}TiO_3$ (which is a material that comprises barium, strontium, titanium, and oxygen).

The ferroelectric insulating layer 108 can comprise other suitable perovskite oxides having the general chemical formula $ABO_3$ or other suitable non-perovskite oxides that have a crystal structure similar to that of a perovskite. For example, in some embodiments, the ferroelectric insulating layer 108 can comprise tungsten trioxide ($WO_3$, which is a material that comprises tungsten and oxygen).

These ferroelectric oxides have a polarization that is greater than a target polarization value for ferroelectric materials for use in embedded DRAM (e.g., 50 $fF/cm^2$), and memory cells employing ferroelectric capacitors comprising these materials can have an endurance of up to $10^9$ cycles, making them attractive for use in embedded memories. Further making these types of ferroelectric capacitors attractive is that the ferroelectric oxides listed below that can comprise the ferroelectric capacitor electrodes and the perovskite ferroelectric oxides listed above that can comprise the ferroelectric capacitor insulating layer can be deposited by processes that are compatible with existing CMOS (complementary MOSFET (metal-oxide-semiconductor field-effect transfer)) manufacturing processes, such as metalorganic chemical vapor deposition (MOCVD) and atomic layer deposition (ALD).

The first electrode 104 and the second electrode 112 can comprise a perovskite oxide, such as strontium vanadate ($SrVO_3$, which is a material that comprises strontium, vanadium, and oxygen), $SrCrO_3$ (which is a material that comprises strontium, chromium, and oxygen), strontium ferrite ($SrFeO_3$, which is a material that comprises strontium, iron, and oxygen), sodium tungsten bronze ($NaWO_3$, which is a material that comprises sodium, tungsten, and oxygen), $KMoO_3$ (which is a material that comprises potassium, molybdenum, and oxygen), strontium niobate ($SrNbO_3$, which is a material that comprises strontium, niobium, and oxygen), lanthanum titanate ($LaTiO_3$, which is a material that comprises lanthanum, titanium, and oxygen), $LaWO_3$ (which is a material that comprises lanthanum, tungsten, and oxygen), strontium ruthenate ($SrRuO_3$, also referred to as SRO, which is a material that comprises strontium, ruthenium, and oxygen), niobium-doped strontium titanate (Nb-doped $SrTiO_3$, also referred to as Nb-STO, which is a material that comprises niobium, strontium, titanium, and oxygen), or lanthanum strontium manganite ($La_{(1-x)}Sr_{(x)}MnO_3$, also referred to as LSMO, which is a material that comprises lanthanum, strontium, manganese, and oxygen). In some embodiments, the first electrode 104 and the second electrode 112 can comprise the same perovskite oxide and in other embodiments, the first electrode 104 and the second electrode 112 can comprise different perovskite oxides. The first electrode 104, the ferroelectric insulating layer 108, and the second electrode 112 can comprise other suitable perovskite oxides having the general chemical formula $ABO_3$ or other suitable non-perovskite oxides that have a crystal structure similar to that of a perovskite. For example, in some embodiments, the first electrode 104 and/or the second electrode 112 can comprise ruthenium triode ($RuO_3$, which is a material that comprises ruthenium and oxygen).

A conductive seed layer 124 is positioned between the first conductive trace 116 and the first electrode 104. The seed layer 124 promotes crystalline growth of the perovskite oxide (or material having a crystal structure similar to that of a perovskite) of the first electrode 104 during formation of the first electrode. The seed layer can comprise tantalum, ruthenium, titanium, titanium nitride (TiN, which is a material comprising titanium and nitrogen), platinum, iridium, or iridium (IV) oxide ($IrO_2$, which is a material comprising iridium and oxygen).

The ferroelectric capacitor 100 is positioned between a first conductive trace 116 and a second conductive trace 120. The first conductive trace 116 and the second conductive trace 120 can be lines that belong to adjacent metal layers in a metallization stack in an integrated circuit component. For example, the first conductive trace 116 can be a Metal 2 (M2) line and the second conductive trace 120 can be an M3 line. The ferroelectric oxide capacitor 100 has a three-dimensional geometry (e.g., a cylindrical capacitor or a rectangular capacitor, possibly with rounded corners).

In some embodiments, the first conductive trace 116 does not extend across the full extent of the seed layer 124 and a portion of the seed layer 124 is thus positioned between an interlayer dielectric (ILD) layer and the first electrode 104. Similarly, in some embodiments, the second conductive trace 120 does not extend across the full extent of the second electrode 112 and a portion of the second electrode 112 is thus positioned between an ILD layer and the ferroelectric insulating layer 108. An ILD layer can be any suitable nitride or oxide, such as silicon dioxide ($SiO_2$, which is a material that comprises silicon and oxygen), carbon-doped (C-doped) silicon dioxide (C-doped $SiO_2$, also known as CDO or organosilicate glass, which is a material that comprises silicon, oxygen, and carbon), fluorine-doped silicon dioxide (F-doped $SiO_2$, also known as fluorosilicate glass, which is a material that comprises fluorine, silicon, and oxygen), hydrogen-doped silicon dioxide (H-doped $SiO_2$, which is a material that comprises silicon, oxygen, and hydrogen), or silicon nitride ($Si_3N_4$, which is a material that comprises silicon and nitrogen). Interlayer dielectric regions 128 are positioned adjacent to the ferroelectric capacitor 100 and between the first conductive trace 116 and the second conductive trace 120. In some embodiments, the ILD regions can comprise an oxide or nitride, such as any of the ILD oxides or nitrides listed above.

The non-planar ferroelectric capacitor 150 illustrated in FIG. 1B comprises a ferroelectric insulating layer 158 positioned between a first electrode 154 and a second electrode 162. The ferroelectric capacitor 150 is positioned between a first conductive trace 166 and a second conductive trace 170. ILD regions 152 are positioned adjacent to the ferroelectric capacitor 150 and adjacent to the second conductive trace 170. The ferroelectric insulating layer 158 and the electrodes 154 and 162 are non-planar. A seed layer 174 is positioned between the first electrode 154 and the first conductive trace 166, and a portion of the ILD regions 152. The first electrode 154, the ferroelectric insulating layer 158, the second electrodes 162, the first conductive trace 166, the second conductive trace 170, and the seed layer 174 can comprise any of the materials listed above that can be used for the corresponding layer or feature illustrated in FIG. 1A. That is, for example, the ferroelectric insulating layer 158 can comprise any of the materials listed above that can comprise the ferroelectric insulating layer 108.

The ferroelectric capacitor 150 is U-shaped with individual of the first electrode 154, the ferroelectric insulating layer 158, the second electrode 162, and the seed layer 174 having a first sidewall portion 178, a second sidewall portion 182, and a bottom portion 186 that connects the first sidewall portion 178 to the second sidewall portion 182. Although the sidewall portions 178 and 182 are illustrated as being perpendicular to the bottom portions 186, the sidewall portions 178 and 182 can be substantially perpendicular to the bottom portions 186 and the ferroelectric capacitor 150 can thus have more of a V-shape than a U-shape in some embodiments, with a distance between the sidewall portions 178 and 182 at a point along the sidewall portions 178 and 182 near the bottom portions 186 being shorter than a distance between the sidewall portions 178 and 182 at a point along the sidewall portions 178 and 182 distal from the bottom portions 186. The sidewall portions 178 and 182 and the bottom portions 186 define a volume that is substantially filled by a via 192. The via 192 can comprise copper, nickel, another metal, or other suitable conductive material.

The edges 190 of the first electrode 154 are located at a point between the bottom portion 186 of the first electrode 154 and the second conductive trace 170. The edges 194 of the ferroelectric insulating layer 158 extend beyond the edges 190 of the first electrode 154 and the edges 196 of the second electrode 162. In other embodiments, the edges 196 of the second electrodes 162 are substantially aligned with or extend past the edges 194 of the ferroelectric insulating layer 158. The edges 198 of the seed layer 174 extend beyond the edges 190 of the first electrode 154 and extend to the edges 194 of the ferroelectric insulating layer 158 so that the seed layer 174 can promote crystalline growth of the ferroelectric insulating layer 158 along the portions of the ferroelectric insulating layer 158 where the first electrode 154 is not positioned between the ferroelectric insulating layer 158 and the ILD regions 152. In some embodiments, the edges 194 of the ferroelectric insulating layer 158 extend beyond the edges 198 of the seed layer 174 such that a portion of the ferroelectric insulating layer 158 is positioned adjacent to the ILD regions 152. In yet other embodiments, the edges 198 of the seed layer 174 are substantially aligned with the edges 190 of the first electrode 154. In still other embodiments, the edges 190 of the first electrode 154 can extend beyond the edges 198 of the seed layer 174.

For ferroelectric capacitors 100 and 150 that occupy the same x-y area (with reference to the references axes shown in FIGS. 1A-1B), the non-planar ferroelectric capacitor 150 can have a higher capacitance than the planar ferroelectric capacitor 100 due to the non-planar ferroelectric capacitor 150 having a larger capacitor area due to the presence of the sidewall portions 178 and 182.

FIG. 1B illustrates a ferroelectric capacitor 150 positioned between conductive traces 166 and 170 on adjacent metal layers in a metallization stack, but in other embodiments, the ferroelectric capacitor 150 can extend between non-adjacent metal layers in a metallization stack, resulting in a ferroelectric capacitor having taller sidewall portions 178 and 182 and thus, a higher capacitance value than the ferroelectric capacitor illustrated in FIG. 1B. For example, the conductive trace 166 can be a line of a Metal 1 (M1) metal layer and the second conductive trace 170 can be a line of a Metal 3 (M3) metal layer or a line of another metallization layer that is higher up in a metallization stack (e.g., Metal 4 (M4), Metal 5 (M5), Metal 6 (M6)).

In some embodiments, the non-planar ferroelectric capacitor 150 can be located above one or more transistors that are part of one or more memory cells (e.g., bit cells, bits). In such embodiments, the memory cell can be referred to as having a COB (capacitor over bitline) structure. The operation of a memory cell comprising a ferroelectric capacitor is discussed in greater detail below.

In some embodiments, multiple non-planar ferroelectric capacitors 150 can be positioned adjacently with one or more of the ferroelectric capacitor layers extending across multiple ferroelectric capacitors. For example, in some embodiments, the seed layer and the ferroelectric insulating layer can extend across adjacent capacitors, with adjacent ferroelectric capacitors having separate first and second electrodes. In other embodiments, a seed layer, a ferroelectric insulating layer, and a second electrode (the electrode positioned distal to the seed layer) can extend across adjacent ferroelectric capacitors, with adjacent ferroelectric capacitors having separate first electrodes (the electrode positioned adjacent to the seed layer). In yet other embodiments, a seed layer, a ferroelectric insulating layer, and a first electrode (the electrode positioned adjacent the seed layer) can extend across adjacent ferroelectric capacitors, with adjacent ferroelectric capacitors having separate second electrodes (the electrode positioned distal to the seed layer).

In some embodiments, the polarization of the ferroelectric insulating layer material can influence the decision whether to implement a ferroelectric capacitor as a planar or non-planar structure. For example, a non-planar structure may be preferable for ferroelectric capacitors having a ferroelectric insulating layer material with a higher polarization and a planar structure may be preferable for ferroelectric capacitors having a ferroelectric insulating layer with a lower polarization.

In some embodiments, the thickness of the ferroelectric insulating layer in the ferroelectric capacitors 100 and 150 is in the range of about 5-40 nm.

Figures 2A, 2B:
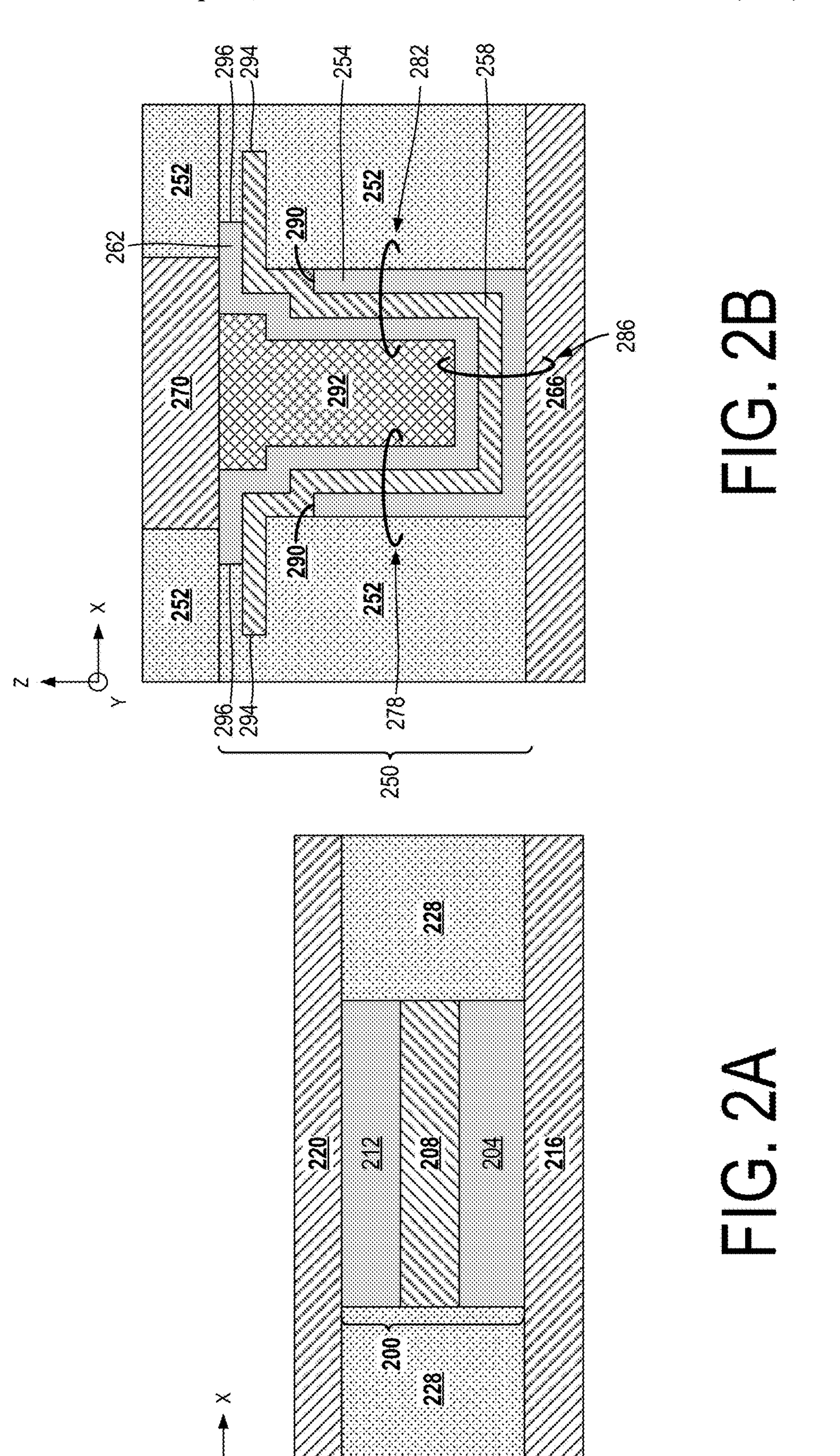
FIGS. 2A-2B illustrate example ferroelectric capacitors comprising ferroelectric monochalcogenides.

FIGS. 2A-2B illustrate example ferroelectric capacitors comprising ferroelectric monochalcogenides. FIG. 2A illustrates an example planar ferroelectric capacitor 200 and FIG. 2B illustrates an example non-planar ferroelectric capacitor 250. The ferroelectric capacitor 200 comprises a ferroelectric insulating layer 208 positioned between a first electrode 204 and a second electrode 212. The ferroelectric insulating layer 208 and the electrodes 204 and 212 are substantially planar and substantially parallel.

The ferroelectric insulating layer 208 comprises a ferroelectric monochalcogenide, a material having the chemical composition MX where M can be tin (Sn) or germanium (Ge) and X can be sulfur(S) or selenium (Se). Thus, the ferroelectric insulating layer 208 can comprise tin and sulfur, tin and selenium, germanium and sulfur, or germanium and selenium. The ferroelectric monochalcogenide insulating layer 208 can be deposited by, for example, physical vapor deposition (e.g., sputtering at 410° C.), making the formation of ferroelectric monochalcogenide insulating layers compatible with existing CMOS manufacturing processes.

The first electrode 204 and/or the second electrode 212 can comprise ruthenium, palladium, graphene, aluminum, copper, tungsten, or titanium nitride (TiN).

The ferroelectric capacitor 200 is positioned between a first conductive trace 216 and a second conductive trace 220. The first conductive trace 216 and the second conductive trace 220 can be lines that belong to adjacent metal layers in a metallization stack in an integrated circuit component. For example, the first conductive trace 216 can be an M2 line and the second conductive trace 220 can be an M3 line.

The ferroelectric oxide capacitor 200 has a three-dimensional geometry (e.g., a cylindrical capacitor or a rectangular capacitor, possibly with rounded corners).

In some embodiments, the first conductive trace 216 may not extend across the full extent of the first electrode 204 and a portion of the first electrode 204 may thus be positioned between the ferroelectric insulating layer 208 an interlayer dielectric (ILD) layer. Similarly, the second conductive trace 220 may not extend across the full extent of the second electrode 212 and a portion of the second electrode 212 may thus be positioned between an ILD layer and the ferroelectric insulating layer 208. The ILD layer can be any suitable nitride or oxide, such as silicon dioxide ($SiO_2$), carbon-doped silicon dioxide (C-doped $SiO_2$), fluorine-doped silicon dioxide (F-doped $SiO_2$), silicon dioxide (H-doped $SiO_2$), and silicon nitride ($Si_3N_4$). Interlayer dielectric (ILD) regions 228 are located adjacent to the ferroelectric capacitor 200 and between the first conductive trace 216 and the second conductive trace 220. The ILD layer regions 228 and any ILD regions positioned adjacent to the electrodes 204 and 212 can comprise an oxide or nitride, such as any of the ILD oxides or nitrides discussed above in regards to FIGS. 1A and 1B.

The non-planar ferroelectric capacitor 250 illustrated in FIG. 2B comprises a ferroelectric insulating layer 258 positioned between a first electrode 254 and a second electrode 262. The ferroelectric capacitor 250 is positioned between a first conductive trace 266 and a second conductive trace 270. ILD regions 252 are positioned adjacent to the ferroelectric capacitor 250 and adjacent to the second conductive trace 270. The ferroelectric insulating layer 258 and the electrodes 254 and 262 are non-planar. The first electrode 254, the ferroelectric insulating layer 258, the second electrode 262, the first conductive trace 266, and the second conductive trace 270, can comprise any of the materials listed above that can be used for the corresponding layer or feature in FIG. 2A. That is, for example, the ferroelectric insulating layer 258 can comprise any of the materials listed above that can comprise the ferroelectric insulating layer 208.

The ferroelectric capacitor 250 is U-shaped with individual of the first electrode 254, the ferroelectric insulating layer 258, the second electrode 262 having a first sidewall portion 278, a second sidewall portion 282 and a bottom portion 286 that connects the first sidewall portion 278 to the second sidewall portion 282. Although the sidewall portions 278 and 282 are illustrated as being perpendicular to the bottom portions 286, the sidewall portions 278 and 282 can be substantially perpendicular to the bottom portions 286 and the ferroelectric capacitor 250 can, in some embodiments, have more of a V-shape than a U-shape, with a distance between the sidewall portions 278 and 282 at a point along the sidewall portions 278 and 282 near the bottom portions 286 being shorter than a distance between the sidewall portions 278 and 282 at a point along the sidewall portions 278 and 282 distal from the bottom portions 286. The sidewall portions 278 and 282 and the bottom portions 286 define a volume that is substantially filled by a via 292. The via 292 can comprise copper, nickel, another metal, or another suitable conductive material.

The edges 290 of the first electrode 254 are located at a point between the bottom portion 286 of the first electrode 254 and the conductive trace 270. The edges 294 of the ferroelectric insulating layer 258 extend beyond the edges 290 of the first electrode 254 and the edges 296 of the second electrode 262. In other embodiments, the edges 296 of the second electrode 262 are substantially aligned with or extend past the edges 294 of the ferroelectric insulating layer 258.

For ferroelectric capacitors 200 and 250 that occupy the same x-y area (with reference to the references axes shown in FIGS. 2A-2B), the non-planar ferroelectric capacitor 250 can have a higher capacitance than the planar ferroelectric capacitor 200 due to the non-planar ferroelectric capacitor 250 having a larger capacitor area due to the presence of the sidewall portions 278 and 282.

FIG. 2B illustrates a ferroelectric capacitor 250 that is positioned between conductive traces 266 and 270 on adjacent metal layers in a metallization stack, but in other embodiments, the ferroelectric capacitor 250 can extend between non-adjacent metal layers, resulting in a ferroelectric capacitor having taller sidewall portions 278 and 282 and thus, a higher capacitance value than the capacitor illustrated in FIG. 2B. For example, the conductive trace 266 can be a line of an M1 layer and the second conductive trace 270 can be a line of an M3 layer or a line of a metal layer higher up in a metallization stack (e.g., M4, M5, M6).

In some embodiments, the non-planar ferroelectric capacitor 250 can be positioned adjacently with one or more transistors that are part of one or more memory cells and such memory cells can be referred to as having a COB structure.

In some embodiments, multiple U-shaped ferroelectric capacitors 250 can be connected in series with one or more ferroelectric capacitor layers extending across multiple ferroelectric capacitors. In some embodiments, a ferroelectric insulating layer can extend across adjacent ferroelectric capacitors, with adjacent ferroelectric capacitors having separate first and second electrodes. In other embodiments, a ferroelectric insulating layer, and a second electrode (e.g., 296) can extend across adjacent ferroelectric capacitors, with adjacent ferroelectric capacitors having separate first electrodes (e.g., 254). In yet other embodiments, a ferroelectric insulating layer, and a first electrode (e.g., 254) can extend across adjacent ferroelectric capacitors, with adjacent ferroelectric capacitors having separate second electrodes (e.g., 296).

In some embodiments, the thickness of the ferroelectric insulating layer in the ferroelectric capacitors 100 and 150 is in the range of about 1-45 nm.

In some embodiments, one or more layers can be positioned between a conductive trace (e.g., 116, 120, 166, 170, 216, 220, 266, 270) and another layer (e.g., via (192, 292), electrode (112, 162, 204, 212, 254, 262), or seed layer (124, 174)) to limit the amount of metal that diffuses from the conductive layer to an adjoining layer and/or promote adhesion of the conductive trace to the adjoining layer. These layers can be referred to as diffusion barrier layers, adhesion promotion liner layers, or diffusion barrier/liner layers. A diffusion barrier/liner layer can comprise, for example, cobalt (Co), ruthenium (Ru), tantalum (Ta), tantalum nitride (which is a material comprising titanium and nitrogen (e.g., TaN, $Ta_2N$, $Ta_3N_5$)), indium oxide ($In_2O_3$, which is a material that comprises indium and oxygen), tungsten nitride (which is a material that comprises tungsten and nitrogen (e.g., $W_2N$, WN, $WN_2$), and titanium nitride (TiN, which is a material that comprises titanium and nitrogen).

Figure 3:
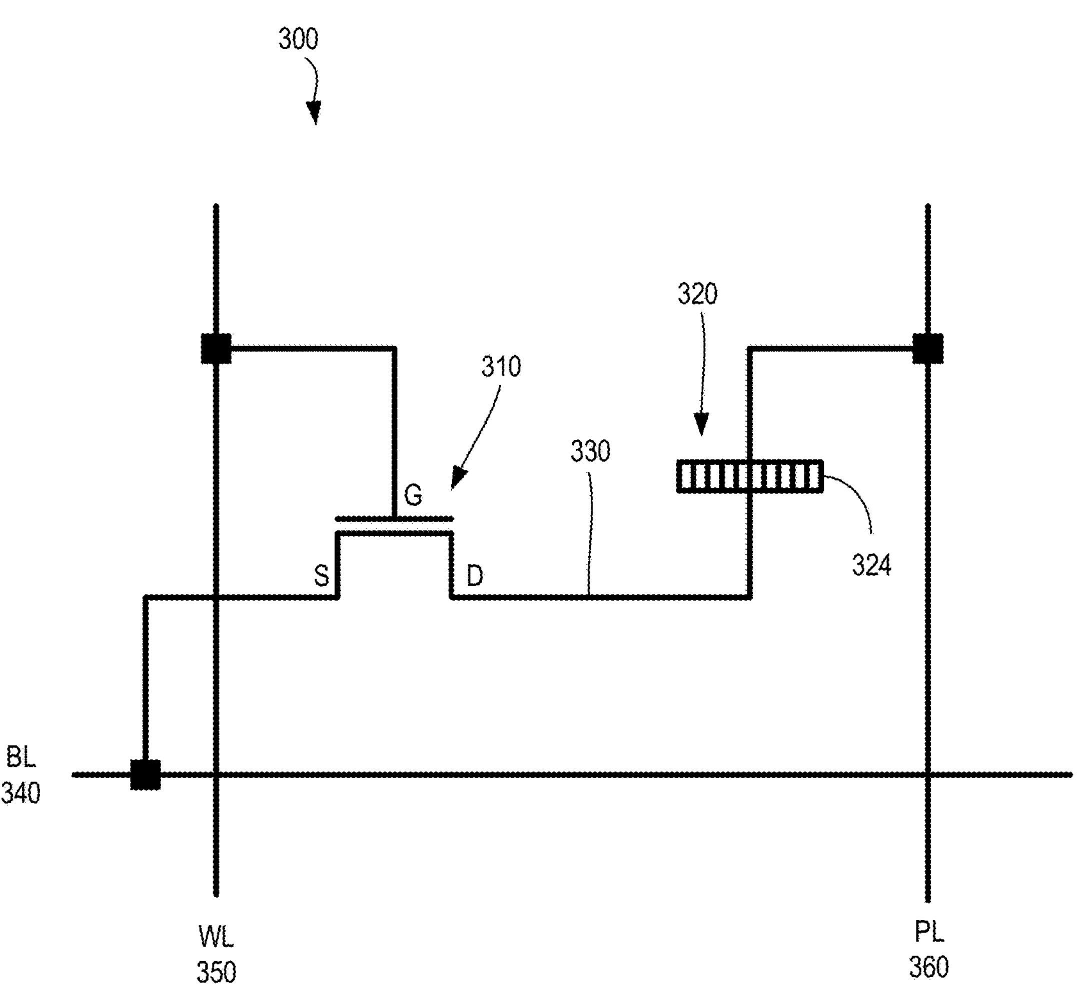
FIG. 3 is a schematic illustration of an example 1T memory cell comprising a ferroelectric capacitor.

FIG. 3 is a schematic illustration of an example 1T (one transistor) memory cell comprising a ferroelectric capacitor as described herein. The magnetization orientation of the ferroelectric material of the insulating layer of the ferroelectric capacitor can represent the logical state of the memory cell, as described above. The memory cell 300 comprises a transistor (pass transistor, access transistor) 310 and a ferroelectric capacitor 320. The transistor 310 has a gate terminal, a source terminal, and a drain terminal indicated in FIG. 3 as terminals G, S, and D, respectively.

The gate terminal of the transistor 310 is coupled to a wordline (WL) 350, the source terminal of the transistor 310 is coupled to a bitline (BL) 340, and the drain terminal of the transistor 310 is coupled to a first electrode of the ferroelectric capacitor 320. The connection between the drain terminal of the transistor 310 and the first electrode of the ferroelectric capacitor 320 define an intermediate node 330. The other electrode of the ferroelectric capacitor 320 is coupled to a capacitor plateline (PL) 360. As described in greater detail below, the WL, BL, and PL may be used together to read and program the memory cell 300. In the following, the electrode of the ferroelectric capacitor 320 coupled to the PL is referred to as a "first capacitor electrode" while the electrode of the ferroelectric capacitor 320 coupled to the transistor is referred to as a "second capacitor electrode."

The BL 340, the WL 350, and the PL 360, as well as intermediate elements coupling these lines to various terminals or electrodes described herein, may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

As is known, source and drain terminals are interchangeable in transistors. Therefore, while the example of FIG. 3 illustrates that the transistor 310 is coupled to the ferroelectric capacitor 320 by its drain terminal, in other embodiments, any one of a source or a drain terminal of the transistor 310 may be coupled to the second electrode of the ferroelectric capacitor 320. A source and a drain terminal of a transistor are sometimes referred to in the following as a "transistor terminal pair" and a "first terminal" of a transistor terminal pair is used to describe, for the transistor 310, the S/D terminal that is connected to the BL 340, while a "second terminal" is used to describe the S/D terminal of the transistor 310 that is connected to the second capacitor electrode of the ferroelectric capacitor 320. The transistor 310 may be any type of FET transistor described or referenced herein, such as a planar FET, FinFET, gate-all-around transistor, or stacked gate-all-around transistor.

A read operation on the memory cell 300 can be performed as follows. Initially, the WL 350 is asserted (e.g., the WL 350 transitions from a logic low voltage value to logic high voltage value to turn on the transistor 310), e.g., by applying a voltage sufficient (a WL voltage greater than the threshold voltage of the transistor 310) to turn on the transistor 310. Once the transistor 310 is switched on, current can flow between the source and drain terminals of the transistor 310. Because the ferroelectric capacitor 320 is connected in series with the transistor 310, if current flows through the transistor 310, then current can also flow across the ferroelectric capacitor 320 (in the form of displacement current). Furthermore, the current flowing through this series of the transistor 310 and the ferroelectric capacitor 320 is modulated (i.e., affected/changed) by the polarization state of the ferroelectric material 324 in the ferroelectric capacitor 320. As described above, the source terminal of the transistor 310 is coupled to the BL 340, and the drain terminal of the transistor 310 is coupled to the second capacitor electrode of the ferroelectric capacitor 320. Therefore, the current through this series of the transistor 310 and the ferroelectric capacitor 320 flows through the BL 340.

Next, the PL 360 is asserted to ensure that the polarization of the ferroelectric material 324 in the ferroelectric capacitor 320 is at a certain known state, e.g., polarization that corresponds to the logic state of "1", and a sense amplifier coupled to the BL 340 senses whether that action causes a change in the current or voltage on the BL 340. In order to ensure that the polarization of the ferroelectric material 324 in the ferroelectric capacitor 320 is at a certain known state, an electric field of suitable magnitude and direction may be applied across the ferroelectric material 324, which may be done by applying a voltage of sufficiently high magnitude and a predefined polarity on the PL 360, for a time period that is equal to or greater than a minimum transition duration.

The term "minimum transition duration" herein refers to a suitable duration of time during which a voltage difference (e.g., due to the voltage on the PL 360, possibly in combination with the charge on the intermediate node 330) is applied across the ferroelectric material 324 to cause the ferroelectric material to be polarized and to store a charge according to the applied voltage. The minimum transition duration may be a predetermined value depending on the materials used in the ferroelectric capacitor 320 and their thicknesses. The minimum transition duration can be designed based on application-specific requirements. In general, longer minimum transition times can enable lower voltage operation, higher read signals, and longer ferroelectric retention.

Prior to a read operation, the BL 340 may be set to an initial value, such as 0 V, and then floated (i.e., disconnected from a voltage source). A sense amplifier is coupled to the BL 340 and is configured to sense the voltage on the BL 340 and convert the magnitude of the sensed voltage to a digital logic value. Because the voltage on the BL 340 depends on the polarization state of the ferroelectric capacitor 320, sensing this voltage allows deducing the polarization state of the ferroelectric capacitor 320. If, prior to asserting the PL 360 to switch the polarization of the ferroelectric material 324 in the ferroelectric capacitor 320 to the known state, the ferroelectric material 324 was already in that state, then there will be little change in voltage on the BL 340 as a result of driving the PL 360. However, if, prior to asserting the PL 360, the ferroelectric material 324 was in a different logic state (i.e., the polarization of the ferroelectric material 324 was different), then, as a result of asserting the PL 360 to switch the polarization of the ferroelectric material 324 to a known state, the sense amplifier will detect the change in voltage on the BL 340.

As the foregoing illustrates, similar to a DRAM memory cell, the memory cell 300 is read by sensing the voltage at the BL 340 through a sense amplifier. However, unlike a DRAM memory cell, the logic state of the memory cell 300 can be stored in the ferroelectric capacitor 320 as a polarization of a ferroelectric material, allowing for longer retention times, as compared to a DRAM memory cell.

The memory cell 300 can be written (programmed) as follows. Initially, the WL 350 is asserted to turn on the transistor 310 and enable the flow of current between the source and drain terminals of the transistor. Next, the BL 340 is asserted to charge or discharge the intermediate node 330.

Then, the ferroelectric capacitor 320 of the memory cell 300 is programmed to a desired state by utilizing the PL 360 according to the charge on the intermediate node 330. Changing the voltage on the PL 360 applies an electric field across the ferroelectric material 324 of the ferroelectric capacitor 320, which can be used to polarize the ferroelectric material 324 in a direction corresponding to the desired logic state.

The ferroelectric memory cell 300 can be written to in a two-phase operation. In a first phase, the PL 360 is driven in one direction (i.e., a first voltage of sufficiently high magnitude and a predefined polarity is applied on the PL 360), for more than a minimum transition duration, to reset, or clear, the ferroelectric capacitor 320. In other words, in the first phase, an electric field is established that is sufficient to polarize the ferroelectric material 324 to a particular known state, e.g., the one corresponding to logic state "0."

As such, depending on the electric field applied across the ferroelectric material 324, a logic state "1" or logic state "0" is stored as charge in the ferroelectric material when the voltage that establishes this electric field is applied for more or equal to the minimum transition duration. This charge can be substantially non-volatile (i.e., it decays over a very long period of time compared to the required storage/retention time). In some cases, non-volatility can be traded for lower voltage operation. For example, potentially the ferroelectric material could be designed to switch faster at a lower voltage but would also depolarize faster and provide a shorter duration of non-volatility (e.g., 1 hour of non-volatile storage) before a refresh is needed.

In a second phase, the PL 360 can be driven in the other direction (i.e., a second voltage of the opposite polarity than that applied in the first phase is applied on the PL 360) to set the ferroelectric capacitor 320 to the desired logic state by providing an electric field, for the minimum transition duration, due to the combination of the voltage applied to the PL 360 and the charge on the intermediate node 330, that is sufficient to switch the polarization of the ferroelectric material 324 from the state set in the first phase of the write operation to the desired state, e.g., the one corresponding to logic state "1." The PL 360 and the WL 350 can then be de-asserted to complete the write operation.

In other embodiments, the ferroelectric memory cell 300 can be written to with various of the operations of the write operation described above performed in different orders. For example, in a first alternative, after the WL is asserted to turn on the transistor 310 the PL 360 can be driven in one direction to reset the ferroelectric capacitor 320. The BL 340 is then driven to charge or discharge the intermediate node 330 and the PL 360 is then driven in the other direction to set the ferroelectric capacitor 320. The PL 360 is then de-asserted, followed by the WL 350 being de-asserted.

The ferroelectric capacitors described herein can be used in any processor unit, integrated circuit component, or computing system described or referenced herein. The ferroelectric capacitors can be fabricated as part of an integrated circuit structure. The integrated circuit structure can comprise a die substrate, such as a die substrate comprising silicon, and one or more interconnect or metal layers. An electrode of a ferroelectric capacitor can connect to lines of an interconnect or metal layer by a via or by being positioned adjacent to a line of a metal layer. The integrated circuit structure can comprise other types of devices, such as electronic transistors (transistors such as CMOS transistors that operate through control of the flow of electric current and that do not rely upon the switching of the magnetization of a layer or component for operation) and/or magnetoelectric spin-orbit (MESO) devices that use magnetoelectric switching to convert an input voltage/charge into a magnetic spin state (e.g., charge-to-spin conversion) and further uses spin-orbit transduction to convert the magnetic spin state back into an output charge/voltage (e.g., spin-to-charge conversion). An integrated circuit component comprising one or more ferroelectric capacitors described herein can be attached to a printed circuit board. In some embodiments, one or more additional integrated circuit components can be attached to the circuit board. In some embodiments, the printed circuit board and the integrated circuit component can be located in a computing device that comprises a housing that encloses the printed circuit board and the integrated circuit component.

Figure 4:
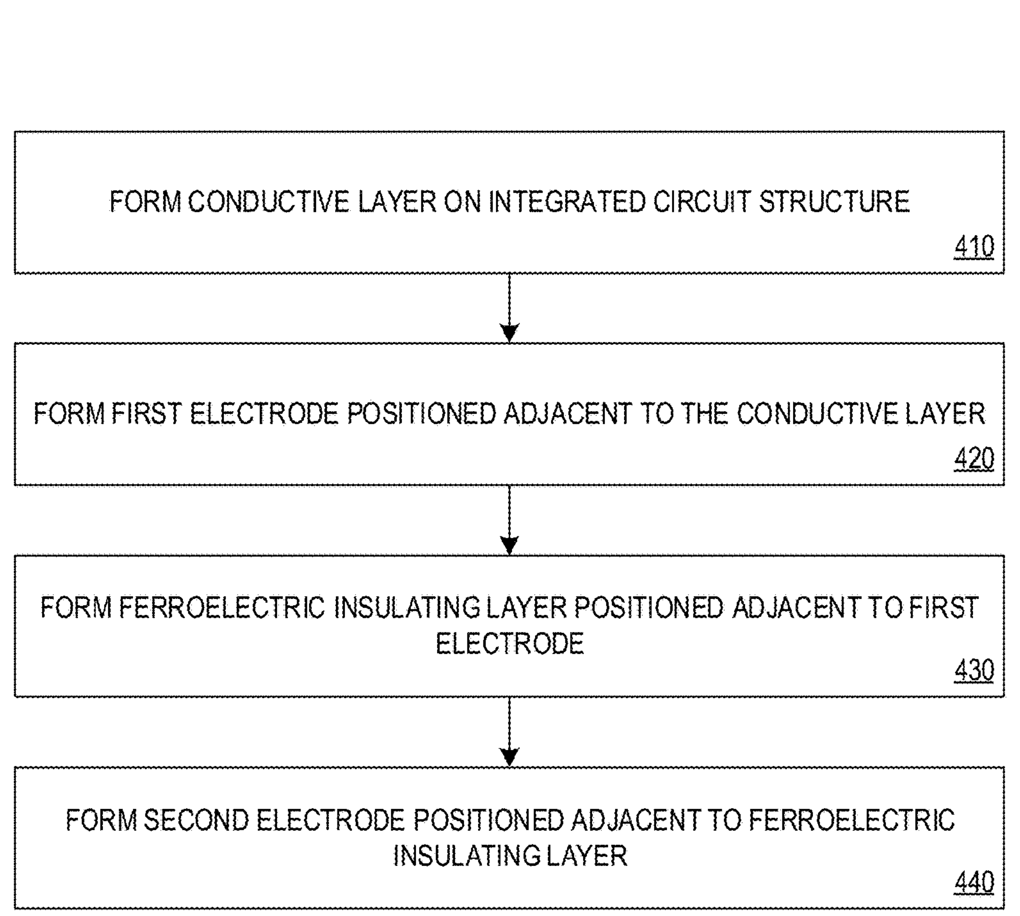
FIG. 4 is an example method of fabricating a ferroelectric capacitor with an insulating layer comprising a perovskite ferroelectric oxide.

FIG. 4 is an example method of fabricating a ferroelectric capacitor with an insulating layer comprising a perovskite ferroelectric oxide. At 410 in the method 400, a conductive layer is formed on an integrated circuit structure. At 420, a first electrode that is positioned adjacent to the conductive layer is formed. The conductive layer acts as a seed layer for the first electrode. At 430, a ferroelectric insulating layer that is positioned adjacent to the first electrode is formed. At 440, a second electrode that is positioned adjacent to the ferroelectric insulating layer is formed. The first electrode, the second electrode, and the ferroelectric insulating layer comprise a perovskite ferroelectric oxide.

In some embodiments, the method 400 can comprise additional elements. For example, the method 400 can further comprise forming a conductive trace prior to forming the conductive layer, the conducting layer positioned between the conductive trace and the first electrode. In another example, the method 400 can further comprise forming a conductive trace prior to forming the conductive layer, the second electrode positioned between the conductive trace and the ferroelectric insulating layer. In yet another example, the method 400 can further comprise forming a dielectric layer positioned adjacent to the conductive layer.

Figure 5:
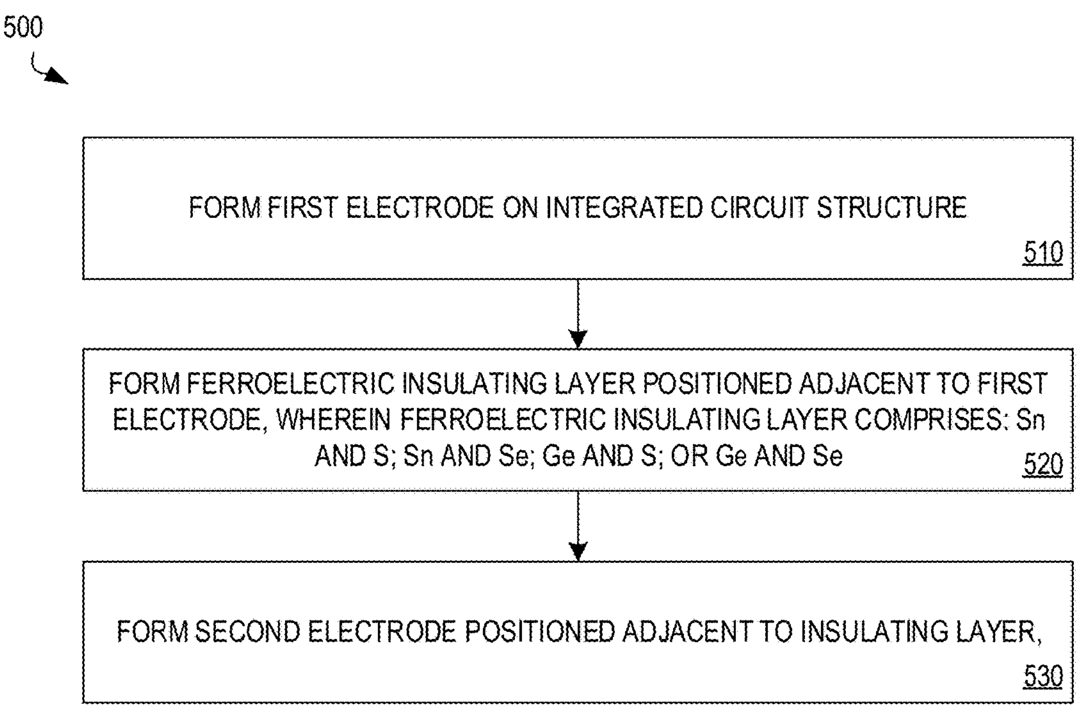
FIG. 5 is an example method of fabricating a ferroelectric capacitor with an insulating layer comprising a ferroelectric monochalcogenide.

FIG. 5 is an example method of fabricating a ferroelectric capacitor with an insulating layer comprising a ferroelectric monochalcogenide. At 510 in the method 500, a first electrode is formed on an integrated circuit structure. At 520, a ferroelectric insulating layer is formed that is positioned adjacent to the first electrode. At 530, a second electrode is formed that is positioned adjacent to the insulating layer. The ferroelectric insulating layer comprises tin and sulfur; tin and selenium; germanium and sulfur; or germanium and selenium.

Figure 6:
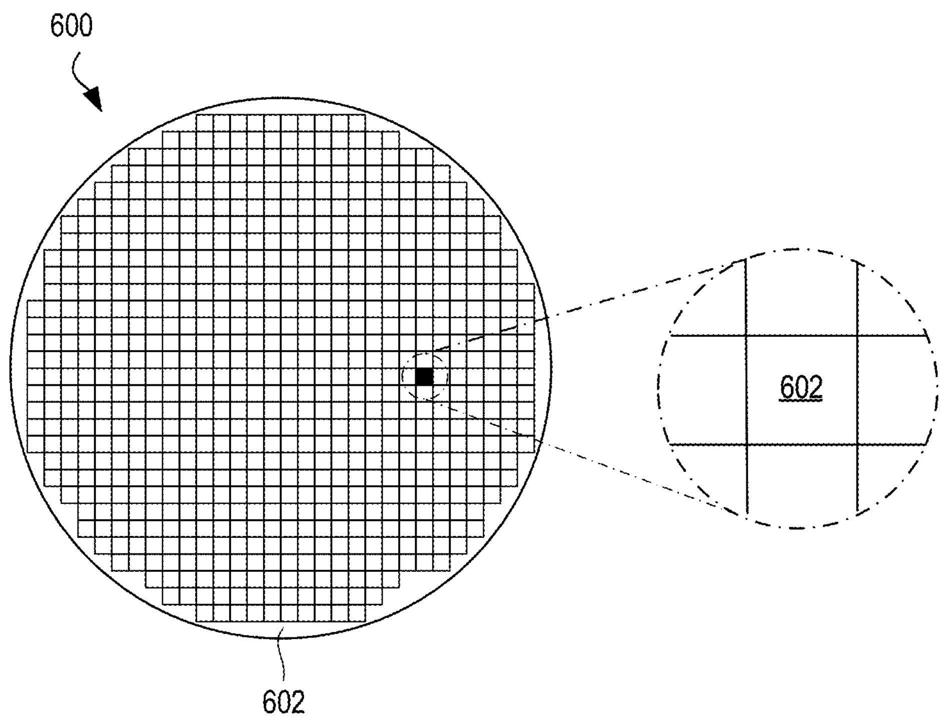
FIG. 6 is a top view of a wafer and dies that may be included in a microelectronic assembly, in accordance with any of the embodiments disclosed herein.

FIG. 6 is a top view of a wafer 600 and dies 602 that may comprise any of the ferroelectric capacitors disclosed herein. The wafer 600 may be composed of semiconductor material and may include one or more dies 602 having integrated circuit structures formed on a surface of the wafer 600. The individual dies 602 may be a repeating unit of an integrated circuit product that includes any suitable integrated circuit. After the fabrication of the semiconductor product is complete, the wafer 600 may undergo a singulation process in which the dies 602 are separated from one another to provide discrete "chips" of the integrated circuit product. The die 602 may include one or more transistors (e.g., some of the transistors 740 of FIG. 7, discussed below), supporting circuitry to route electrical signals to the transistors, passive components (e.g., signal traces, resistors, capacitors, or inductors), and/or any other integrated circuit components. In some embodiments, the wafer 600 or the die 602 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processor unit (e.g., the processor unit 1002 of FIG. 10) or other logic that is configured to store information in the memory devices or execute instructions stored in the memory array.

Figure 7:
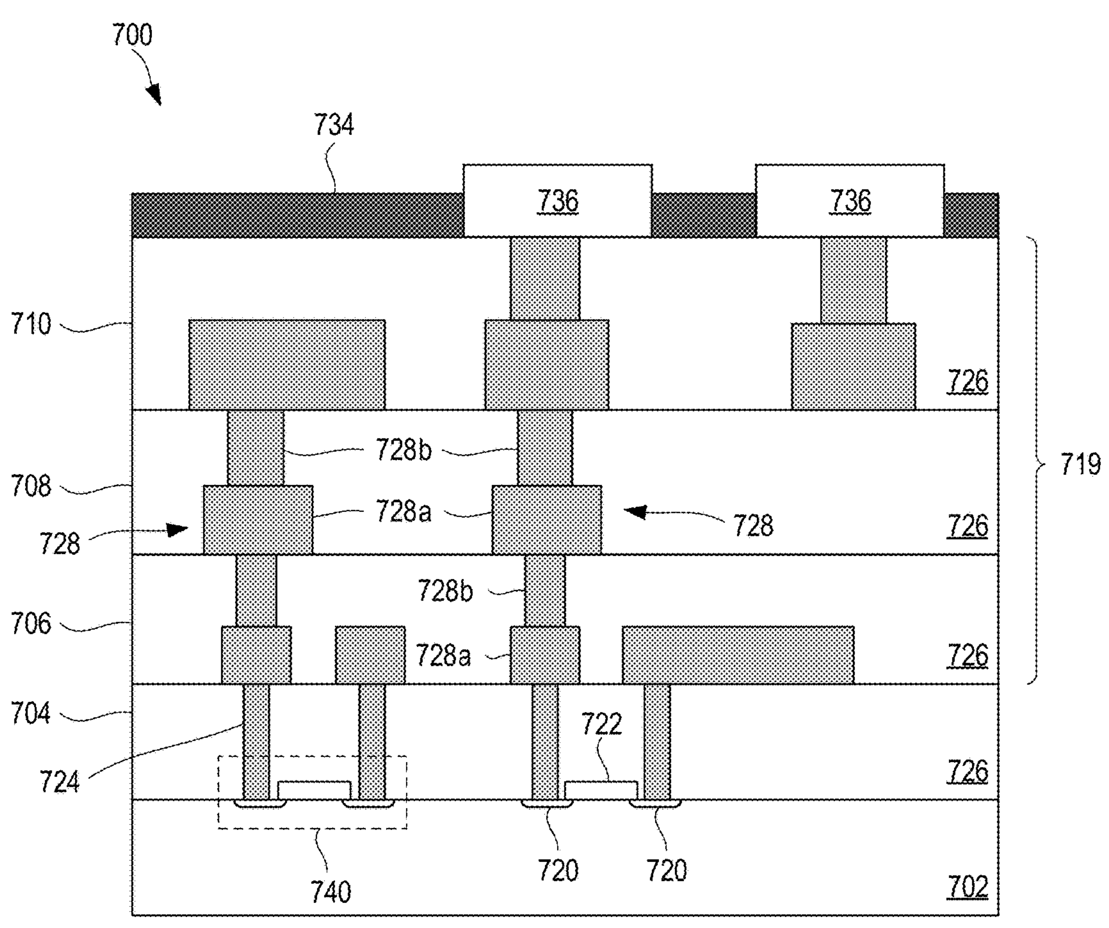
FIG. 7 is a cross-sectional side view of an integrated circuit device that may be included in a microelectronic assembly, in accordance with any of the embodiments disclosed herein.

FIG. 7 is a cross-sectional side view of an integrated circuit device 700 that may include any of the ferroelectric capacitors disclosed herein. One or more of the integrated circuit devices 700 may be included in one or more dies 602 (FIG. 6). The integrated circuit device 700 may be formed on a die substrate 702 (e.g., the wafer 600 of FIG. 6) and may be included in a die (e.g., the die 602 of FIG. 6). The die substrate 702 may be a semiconductor substrate composed of semiconductor material systems including, for example, n-type or p-type materials systems (or a combination of both). The die substrate 702 may include, for example, a crystalline substrate formed using a bulk silicon or a silicon-on-insulator (SOI) substructure. In some embodiments, the die substrate 702 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 702. Although a few examples of materials from which the die substrate 702 may be formed are described here, any material that may serve as a foundation for an integrated circuit device 700 may be used. The die substrate 702 may be part of a singulated die (e.g., the dies 602 of FIG. 6) or a wafer (e.g., the wafer 600 of FIG. 6).

The integrated circuit device 700 may include one or more device layers 704 disposed on the die substrate 702. The device layer 704 may include features of one or more transistors 740 (e.g., metal oxide semiconductor field-effect transistors (MOSFETs)) formed on the die substrate 702. The transistors 740 may include, for example, one or more source and/or drain (S/D) regions 720, a gate 722 to control current flow between the S/D regions 720, and one or more S/D contacts 724 to route electrical signals to/from the S/D regions 720. The transistors 740 may include additional features not depicted for the sake of clarity, such as device isolation regions, gate contacts, and the like. The transistors 740 are not limited to the type and configuration depicted in FIG. 7 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

FIGS. 8A-8D are simplified perspective views of example planar, FinFET, gate-all-around, and stacked gate-all-around transistors. The transistors illustrated in FIGS. 8A-8D are formed on a substrate 816 having a surface 808. Isolation regions 814 separate the source and drain regions of the transistors from other transistors and from a bulk region 818 of the substrate 816.

Figures 8A, 8B, 8C, 8D:
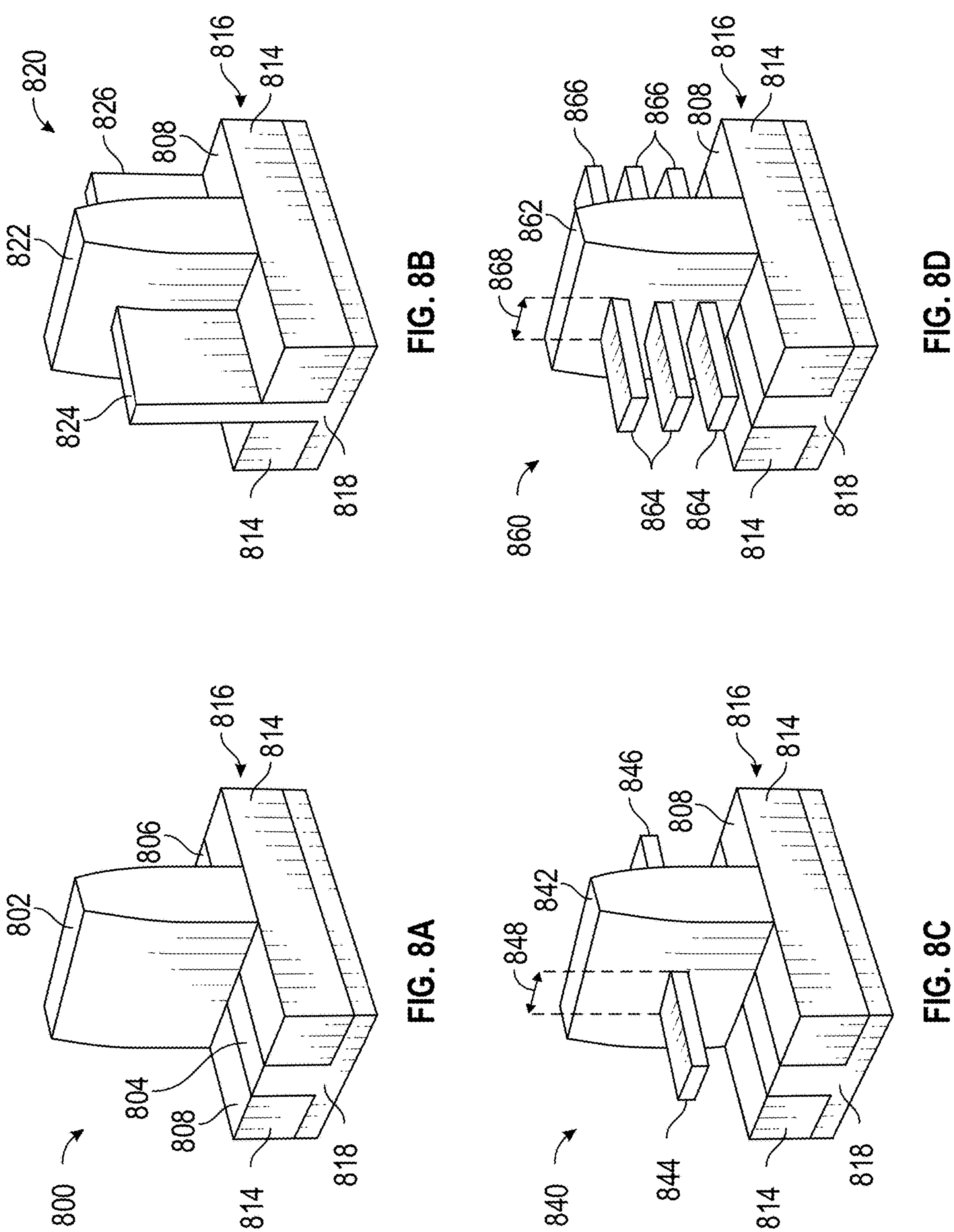
FIGS. 8A-8D are perspective views of example planar, FinFET, gate-all-around, and stacked gate-all-around transistors.

FIG. 8A is a perspective view of an example planar transistor 800 comprising a gate 802 that controls current flow between a source region 804 and a drain region 806. The transistor 800 is planar in that the source region 804 and the drain region 806 are planar with respect to the substrate surface 808.

FIG. 8B is a perspective view of an example FinFET transistor 820 comprising a gate 822 that controls current flow between a source region 824 and a drain region 826. The transistor 820 is non-planar in that the source region 824 and the drain region 826 comprise "fins" that extend upwards from the substrate surface 808. As the gate 822 encompasses three sides of the semiconductor fin that extends from the source region 824 to the drain region 826, the transistor 820 can be considered a tri-gate transistor. FIG. 8B illustrates one S/D fin extending through the gate 822, but multiple S/D fins can extend through the gate of a FinFET transistor.

FIG. 8C is a perspective view of a gate-all-around (GAA) transistor 840 comprising a gate 842 that controls current flow between a source region 844 and a drain region 846. The transistor 840 is non-planar in that the source region 844 and the drain region 846 are elevated from the substrate surface 808.

FIG. 8D is a perspective view of a GAA transistor 860 comprising a gate 862 that controls current flow between multiple elevated source regions 864 and multiple elevated drain regions 866. The transistor 860 is a stacked GAA transistor as the gate controls the flow of current between multiple elevated S/D regions in a stacked configuration. The transistors 840 and 860 are considered gate-all-around transistors as the gates encompass all sides of the semiconductor portions that extends from the source regions to the drain regions. The transistors 840 and 860 can alternatively be referred to as nanowire, nanosheet, or nanoribbon transistors depending on the width (e.g., widths 848 and 868 of transistors 840 and 860, respectively) of the semiconductor portions extending through the gate.

Returning to FIG. 7, a transistor 740 may include a gate 722 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 740 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 740 along the source-channel-drain direction, the gate electrode may consist of a U-shaped structure that includes a bottom portion substantially parallel to the surface of the die substrate 702 and two sidewall portions that are substantially perpendicular to the top surface of the die substrate 702. In other embodiments, at least one of the metal layers that form the gate electrode may simply be a planar layer that is substantially parallel to the top surface of the die substrate 702 and does not include sidewall portions substantially perpendicular to the top surface of the die substrate 702. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 720 may be formed within the die substrate 702 adjacent to the gate 722 of individual transistors 740. The S/D regions 720 may be formed using an implantation/diffusion process or an etching/deposition process, for example. In the former process, dopants such as boron, aluminum, antimony, phosphorous, or arsenic may be ion-implanted into the die substrate 702 to form the S/D regions 720. An annealing process that activates the dopants and causes them to diffuse farther into the die substrate 702 may follow the ion-implantation process. In the latter process, the die substrate 702 may first be etched to form recesses at the locations of the S/D regions 720. An epitaxial deposition process may then be carried out to fill the recesses with material that is used to fabricate the S/D regions 720. In some implementations, the S/D regions 720 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 720 may be formed using one or more alternate semiconductor materials such as germanium or a group III-V material or alloy. In further embodiments, one or more layers of metal and/or metal alloys may be used to form the S/D regions 720.

Electrical signals, such as power and/or input/output (I/O) signals, may be routed to and/or from the devices (e.g., transistors 740) of the device layer 704 through one or more interconnect or metal layers disposed on the device layer 704 (illustrated in FIG. 7 as interconnect or metal layers 706-710). For example, electrically conductive features of the device layer 704 (e.g., the gate 722 and the S/D contacts 724) may be electrically coupled with the interconnect structures 728 of the interconnect layers 706-710. The one or more interconnect layers 706-710 may form a metallization stack (also referred to as an "ILD stack") 719 of the integrated circuit device 700.

The interconnect structures 728 may be arranged within the interconnect layers 706-710 to route electrical signals according to a wide variety of designs; in particular, the arrangement is not limited to the particular configuration of interconnect structures 728 depicted in FIG. 7. Although a particular number of interconnect layers 706-710 is depicted in FIG. 7, embodiments of the present disclosure include integrated circuit devices having more or fewer interconnect layers than depicted.

In some embodiments, the interconnect structures 728 may include lines **728*a* and/or vias 728*b* filled with an electrically conductive material such as a metal. The lines 728*a* may be arranged to route electrical signals in a direction of a plane that is substantially parallel with a surface of the die substrate 702 upon which the device layer 704 is formed. For example, the lines 728*a* may route electrical signals in a direction in and out of the page and/or in a direction across the page from the perspective of FIG. 7. The vias 728*b* may be arranged to route electrical signals in a direction of a plane that is substantially perpendicular to the surface of the die substrate 702 upon which the device layer 704 is formed. In some embodiments, the vias 728*b* may electrically couple lines 728*a* of different interconnect layers 706-710** together.

The interconnect layers 706-710 may include a dielectric material 726 disposed between the interconnect structures 728, as shown in FIG. 7. In some embodiments, dielectric material 726 disposed between the interconnect structures 728 in different ones of the interconnect layers 706-710 may have different compositions; in other embodiments, the composition of the dielectric material 726 between different interconnect layers 706-710 may be the same. The device layer 704 may include a dielectric material 726 disposed between the transistors 740 and a bottom layer of the metallization stack as well. The dielectric material 726 included in the device layer 704 may have a different composition than the dielectric material 726 included in the interconnect layers 706-710; in other embodiments, the composition of the dielectric material 726 in the device layer 704 may be the same as a dielectric material 726 included in any one of the interconnect layers 706-710.

A first interconnect or metal layer 706 (referred to as Metal 1 or "M1") may be formed directly on the device layer 704. In some embodiments, the first interconnect layer 706 may include lines **728*a* and/or vias 728*b*, as shown. The lines 728*a* of the first interconnect layer 706 may be coupled with contacts (e.g., the S/D contacts 724) of the device layer 704. The vias 728*b* of the first interconnect layer 706 may be coupled with the lines 728*a* of a second interconnect layer 708**.

The second interconnect or metal layer 708 (referred to as Metal 2 or "M2") may be formed directly on the first interconnect layer 706. In some embodiments, the second interconnect layer 708 may include via **728*b* to couple the lines 728*a* of the second interconnect layer 708 with the lines 728*a* of a third interconnect layer 710. Although the lines 728*a* and the vias 728*b* are structurally delineated with a line within individual interconnect layers for the sake of clarity, the lines 728*a* and the vias 728*b*** may be structurally and/or materially contiguous (e.g., simultaneously filled during a dual-damascene process) in some embodiments.

The third interconnect or metal layer 710 (referred to as Metal 3 or "M3") (and additional interconnect layers, as desired) may be formed in succession on the second interconnect layer 708 according to similar techniques and configurations described in connection with the second interconnect layer 708 or the first interconnect layer 706. In some embodiments, the interconnect layers that are "higher up" in the metallization stack 719 in the integrated circuit device 700 (i.e., farther away from the device layer 704) may be thicker that the interconnect layers that are lower in the metallization stack 719, with lines **728*a* and vias 728*b*** in the higher interconnect layers being thicker than those in the lower interconnect layers.

The integrated circuit device 700 may include a solder resist material 734 (e.g., polyimide or similar material) and one or more conductive contacts 736 formed on the interconnect layers 706-710. In FIG. 7, the conductive contacts 736 are illustrated as taking the form of bond pads. The conductive contacts 736 may be electrically coupled with the interconnect structures 728 and configured to route the electrical signals of the transistor(s) 740 to external devices. For example, solder bonds may be formed on the one or more conductive contacts 736 to mechanically and/or electrically couple an integrated circuit die including the integrated circuit device 700 with another component (e.g., a printed circuit board). The integrated circuit device 700 may include additional or alternate structures to route the electrical signals from the interconnect layers 706-710; for example, the conductive contacts 736 may include other analogous features (e.g., posts) that route the electrical signals to external components.

In some embodiments in which the integrated circuit device 700 is a double-sided die, the integrated circuit device 700 may include another metallization stack (not shown) on the opposite side of the device layer(s) 704. This metallization stack may include multiple interconnect layers as discussed above with reference to the interconnect layers 706-710, to provide conductive pathways (e.g., including conductive lines and vias) between the device layer(s) 704 and additional conductive contacts (not shown) on the opposite side of the integrated circuit device 700 from the conductive contacts 736.

In other embodiments in which the integrated circuit device 700 is a double-sided die, the integrated circuit device 700 may include one or more through silicon vias (TSVs) through the die substrate 702; these TSVs may make contact with the device layer(s) 704, and may provide conductive pathways between the device layer(s) 704 and additional conductive contacts (not shown) on the opposite side of the integrated circuit device 700 from the conductive contacts 736. In some embodiments, TSVs extending through the substrate can be used for routing power and ground signals from conductive contacts on the opposite side of the integrated circuit device 700 from the conductive contacts 736 to the transistors 740 and any other components integrated into the die 602, and the metallization stack 719 can be used to route I/O signals from the conductive contacts 736 to transistors 740 and any other components integrated into the die 602.

Multiple integrated circuit devices 700 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 9:
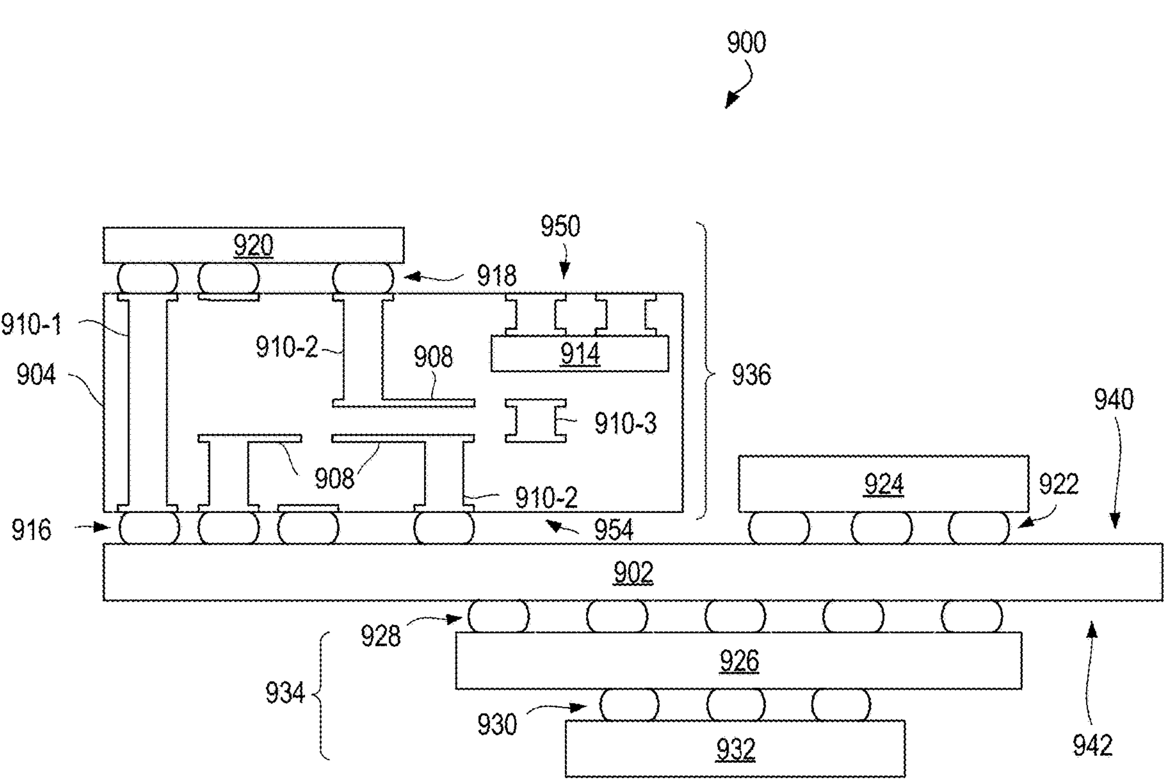
FIG. 9 is a cross-sectional side view of an integrated circuit device assembly that may include a microelectronic assembly, in accordance with any of the embodiments disclosed herein.

FIG. 9 is a cross-sectional side view of an integrated circuit device assembly 900 that may include any of the ferroelectric capacitors disclosed herein. The integrated circuit device assembly 900 includes a number of components disposed on a circuit board 902 (which may be a motherboard, system board, mainboard, etc.). The integrated circuit device assembly 900 includes components disposed on a first face 940 of the circuit board 902 and an opposing second face 942 of the circuit board 902; generally, components may be disposed on one or both faces 940 and 942.

In some embodiments, the circuit board 902 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 902. In other embodiments, the circuit board 902 may be a non-PCB substrate. The integrated circuit device assembly 900 illustrated in FIG. 9 includes a package-on-interposer structure 936 coupled to the first face 940 of the circuit board 902 by coupling components 916. The coupling components 916 may electrically and mechanically couple the package-on-interposer structure 936 to the circuit board 902, and may include solder balls (as shown in FIG. 9), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 936 may include an integrated circuit component 920 coupled to an interposer 904 by coupling components 918. The coupling components 918 may take any suitable form for the application, such as the forms discussed above with reference to the coupling components 916. Although a single integrated circuit component 920 is shown in FIG. 9, multiple integrated circuit components may be coupled to the interposer 904; indeed, additional interposers may be coupled to the interposer 904. The interposer 904 may provide an intervening substrate used to bridge the circuit board 902 and the integrated circuit component 920.

The integrated circuit component 920 may be a packaged or unpacked integrated circuit product that includes one or more integrated circuit dies (e.g., the die 602 of FIG. 6, the integrated circuit device 700 of FIG. 7) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 920, a single monolithic integrated circuit die comprises solder bumps attached to contacts on the die. The solder bumps allow the die to be directly attached to the interposer 904. The integrated circuit component 920 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 920 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 920 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 920 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 904 may spread connections to a wider pitch or reroute a connection to a different connection. For example, the interposer 904 may couple the integrated circuit component 920 to a set of ball grid array (BGA) conductive contacts of the coupling components 916 for coupling to the circuit board 902. In the embodiment illustrated in FIG. 9, the integrated circuit component 920 and the circuit board 902 are attached to opposing sides of the interposer 904; in other embodiments, the integrated circuit component 920 and the circuit board 902 may be attached to a same side of the interposer 904. In some embodiments, three or more components may be interconnected by way of the interposer 904.

In some embodiments, the interposer 904 may be formed as a PCB, including multiple metal layers separated from one another by layers of dielectric material and interconnected by electrically conductive vias. In some embodiments, the interposer 904 may be formed of an epoxy resin, a fiberglass-reinforced epoxy resin, an epoxy resin with inorganic fillers, a ceramic material, or a polymer material such as polyimide. In some embodiments, the interposer 904 may be formed of alternate rigid or flexible materials that may include the same materials described above for use in a semiconductor substrate, such as silicon, germanium, and other group III-V and group IV materials. The interposer 904 may include metal interconnects 908 and vias 910, including but not limited to through hole vias 910-1 (that extend from a first face 950 of the interposer 904 to a second face 954 of the interposer 904), blind vias 910-2 (that extend from the first or second faces 950 or 954 of the interposer 904 to an internal metal layer), and buried vias 910-3 (that connect internal metal layers).

In some embodiments, the interposer 904 can comprise a silicon interposer. Through silicon vias (TSV) extending through the silicon interposer can connect connections on a first face of a silicon interposer to an opposing second face of the silicon interposer. In some embodiments, an interposer 904 comprising a silicon interposer can further comprise one or more routing layers to route connections on a first face of the interposer 904 to an opposing second face of the interposer 904.

The interposer 904 may further include embedded devices 914, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 904. The package-on-interposer structure 936 may take the form of any of the package-on-interposer structures known in the art. In embodiments where the interposer is a non-printed circuit board The integrated circuit device assembly 900 may include an integrated circuit component 924 coupled to the first face 940 of the circuit board 902 by coupling components 922. The coupling components 922 may take the form of any of the embodiments discussed above with reference to the coupling components 916, and the integrated circuit component 924 may take the form of any of the embodiments discussed above with reference to the integrated circuit component 920.

The integrated circuit device assembly 900 illustrated in FIG. 9 includes a package-on-package structure 934 coupled to the second face 942 of the circuit board 902 by coupling components 928. The package-on-package structure 934 may include an integrated circuit component 926 and an integrated circuit component 932 coupled together by coupling components 930 such that the integrated circuit component 926 is disposed between the circuit board 902 and the integrated circuit component 932. The coupling components 928 and 930 may take the form of any of the embodiments of the coupling components 916 discussed above, and the integrated circuit components 926 and 932 may take the form of any of the embodiments of the integrated circuit component 920 discussed above. The package-on-package structure 934 may be configured in accordance with any of the package-on-package structures known in the art.

Figure 10:
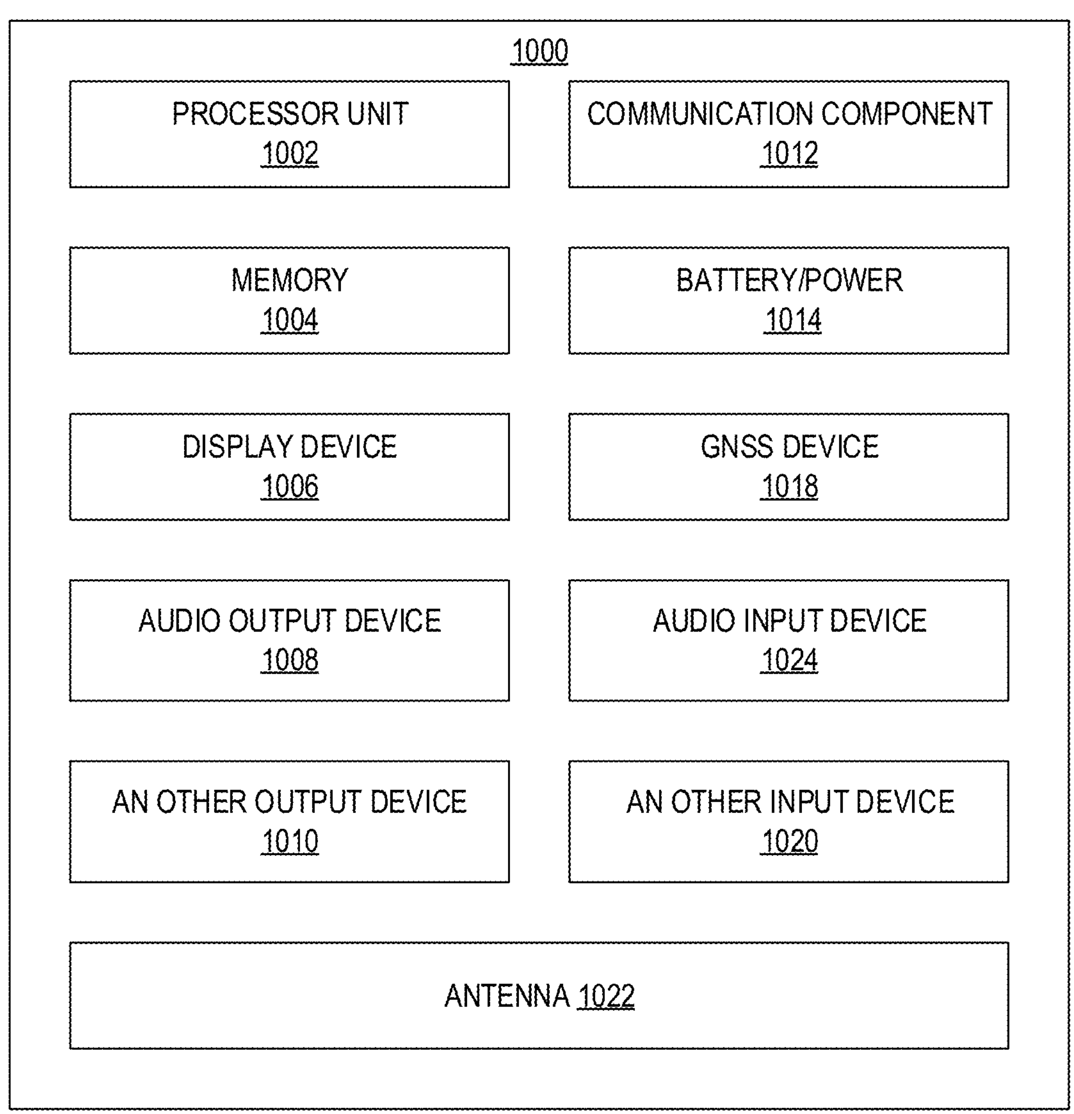
FIG. 10 is a block diagram of an example electrical device that may include a microelectronic assembly, in accordance with any of the embodiments disclosed herein.

FIG. 10 is a block diagram of an example electrical device 1000 that may include one or more of the ferroelectric capacitors disclosed herein. For example, any suitable ones of the components of the electrical device 1000 may include one or more of the integrated circuit device assemblies 900, integrated circuit components 920, integrated circuit devices 700, or integrated circuit dies 602 disclosed herein. A number of components are illustrated in FIG. 10 as included in the electrical device 1000, but any one or more of these components may be omitted or duplicated, as suitable for the application. In some embodiments, some or all of the components included in the electrical device 1000 may be attached to one or more motherboards mainboards, or system boards. In some embodiments, one or more of these components are fabricated onto a single system-on-a-chip (SoC) die.

Additionally, in various embodiments, the electrical device 1000 may not include one or more of the components illustrated in FIG. 10, but the electrical device 1000 may include interface circuitry for coupling to the one or more components. For example, the electrical device 1000 may not include a display device 1006, but may include display device interface circuitry (e.g., a connector and driver circuitry) to which a display device 1006 may be coupled. In another set of examples, the electrical device 1000 may not include an audio input device 1024 or an audio output device 1008, but may include audio input or output device interface circuitry (e.g., connectors and supporting circuitry) to which an audio input device 1024 or audio output device 1008 may be coupled.

The electrical device 1000 may include one or more processor units 1002 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1002 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1000 may include a memory 1004, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1004 may include memory that is located on the same integrated circuit die as the processor unit 1002. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1000 can comprise one or more processor units 1002 that are heterogeneous or asymmetric to another processor unit 1002 in the electrical device 1000. There can be a variety of differences between the processing units 1002 in a system in terms of a spectrum of metrics of merit including architectural, microarchitectural, thermal, power consumption characteristics, and the like. These differences can effectively manifest themselves as asymmetry and heterogeneity among the processor units 1002 in the electrical device 1000.

In some embodiments, the electrical device 1000 may include a communication component 1012 (e.g., one or more communication components). For example, the communication component 1012 can manage wireless communications for the transfer of data to and from the electrical device 1000. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1012 may operate in accordance with other wireless protocols in other embodiments. The electrical device 1000 may include an antenna 1022 to facilitate wireless communications and/or to receive other wireless communications (such as AM or FM radio transmissions).

In some embodiments, the communication component 1012 may manage wired communications, such as electrical, optical, or any other suitable communication protocols (e.g., IEEE 802.3 Ethernet standards). As noted above, the communication component 1012 may include multiple communication components. For instance, a first communication component 1012 may be dedicated to shorter-range wireless communications such as Wi-Fi or Bluetooth, and a second communication component 1012 may be dedicated to longer-range wireless communications such as global positioning system (GPS), EDGE, GPRS, CDMA, WiMAX, LTE, EV-DO, or others. In some embodiments, a first communication component 1012 may be dedicated to wireless communications, and a second communication component 1012 may be dedicated to wired communications.

The electrical device 1000 may include battery/power circuitry 1014. The battery/power circuitry 1014 may include one or more energy storage devices (e.g., batteries or capacitors) and/or circuitry for coupling components of the electrical device 1000 to an energy source separate from the electrical device 1000 (e.g., AC line power).

The electrical device 1000 may include a display device 1006 (or corresponding interface circuitry, as discussed above). The display device 1006 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1000 may include an audio output device 1008 (or corresponding interface circuitry, as discussed above). The audio output device 1008 may include any embedded or wired or wirelessly connected external device that generates an audible indicator, such speakers, headsets, or earbuds.

The electrical device 1000 may include an audio input device 1024 (or corresponding interface circuitry, as discussed above). The audio input device 1024 may include any embedded or wired or wirelessly connected device that generates a signal representative of a sound, such as microphones, microphone arrays, or digital instruments (e.g., instruments having a musical instrument digital interface (MIDI) output). The electrical device 1000 may include a Global Navigation Satellite System (GNSS) device 1018 (or corresponding interface circuitry, as discussed above), such as a Global Positioning System (GPS) device. The GNSS device 1018 may be in communication with a satellite-based system and may determine a geolocation of the electrical device 1000 based on information received from one or more GNSS satellites, as known in the art.

The electrical device 1000 may include an other output device 1010 (or corresponding interface circuitry, as discussed above). Examples of the other output device 1010 may include an audio codec, a video codec, a printer, a wired or wireless transmitter for providing information to other devices, or an additional storage device.

The electrical device 1000 may include an other input device 1020 (or corresponding interface circuitry, as discussed above). Examples of the other input device 1020 may include an accelerometer, a gyroscope, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, any other sensor, or a radio frequency identification (RFID) reader.

The electrical device 1000 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1000 may be any other electronic device that processes data. In some embodiments, the electrical device 1000 may comprise multiple discrete physical components. Given the range of devices that the electrical device 1000 can be manifested as in various embodiments, in some embodiments, the electrical device 1000 can be referred to as a computing device or a computing system.

As used in this application and the claims, a list of items joined by the term "and/or" can mean any combination of the listed items. For example, the phrase "A, B and/or C" can mean A; B; C; A and B; A and C; B and C; or A, B and C. As used in this application and the claims, a list of items joined by the term "at least one of" can mean any combination of the listed terms. For example, the phrase "at least one of A, B or C" can mean A; B; C; A and B; A and C; B and C; or A, B, and C. Moreover, as used in this application and the claims, a list of items joined by the term "one or more of" can mean any combination of the listed terms. For example, the phrase "one or more of A, B and C" can mean A; B; C; A and B; A and C; B and C; or A, B, and C.

As used in this application and the claims, the phrase "individual of" or "respective of" following by a list of items recited or stated as having a trait, feature, etc. means that all of the items in the list possess the stated or recited trait, feature, etc. For example, the phrase "individual of A, B, or C, comprise a sidewall" or "respective of A, B, or C, comprise a sidewall" means that A comprises a sidewall, B comprises sidewall, and C comprises a sidewall.

The disclosed methods, apparatuses, and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

The following examples pertain to additional embodiments of technologies disclosed herein.

Example 1 is an apparatus comprising: a capacitor comprising: a first electrode; a second electrode; and a ferroelectric insulating layer positioned between the first electrode and the second electrode, wherein the first electrode comprises a ferroelectric oxide, the second electrode comprises a ferroelectric oxide, and the ferroelectric insulating layer comprises a ferroelectric oxide; and a conductive layer positioned adjacent to the first electrode, the conductive layer comprising: tantalum; ruthenium; titanium; titanium and nitrogen; iridium; or iridium and oxygen.

Example 2 is an apparatus comprising: a capacitor comprising: a first electrode; a second electrode; and a ferroelectric insulating layer positioned between the first electrode and the second electrode, wherein the first electrode comprises a perovskite ferroelectric oxide, the second electrode comprises a perovskite ferroelectric oxide, and the ferroelectric insulating layer comprises a perovskite ferroelectric oxide; and a seed layer positioned adjacent to the first electrode.

Example 3 comprises the apparatus of example 1 or 2, further comprising a dielectric layer positioned adjacent to at least a portion of the conductive layer, the dielectric layer comprising: silicon and oxygen; silicon, oxygen, and carbon; silicon, oxygen, and fluorine; silicon, oxygen, and hydrogen; or silicon and nitrogen.

Example 4 comprises the apparatus of example 1 or 2, wherein the first electrode comprises a perovskite ferroelectric oxide, the second electrode comprises a perovskite ferroelectric oxide, and the ferroelectric insulating layer comprises a perovskite ferroelectric oxide.

Example 5 comprises the apparatus of example 4, wherein the ferroelectric insulating layer comprises barium, titanium, and oxygen.

Example 6 comprises the apparatus of example 4, wherein the ferroelectric insulating layer comprises: bismuth, iron, and oxygen; bismuth, iron, oxygen, and samarium; or bismuth, iron, oxygen, and lanthanum.

Example 7 comprises the apparatus of example 4, wherein the ferroelectric insulating layer comprises lead, zirconium, titanium, and oxygen.

Example 8 comprises the apparatus of example 4, wherein the ferroelectric insulating layer comprises lithium, tantalum, and oxygen.

Example 9 comprises the apparatus of example 4, wherein the ferroelectric insulating layer comprises lithium, niobium, and oxygen.

Example 10 comprises the apparatus of example 4, wherein the ferroelectric insulating layer comprises sodium, tantalum, and oxygen.

Example 11 comprises the apparatus of example 4, wherein the ferroelectric insulating layer comprises strontium, titanium, and oxygen.

Example 12 comprises the apparatus of example 4, wherein the ferroelectric insulating layer comprises potassium, tantalum, and oxygen.

Example 13 comprises the apparatus of example 4, wherein the ferroelectric insulating layer comprises barium, strontium, titanium, and oxygen.

Example 14 comprises the apparatus of any one of examples 4-13, wherein the first electrode and/or the second electrode comprises strontium, vanadium, and oxygen.

Example 15 comprises the apparatus of any one of examples 4-13, wherein the first electrode and/or the second electrode comprises strontium, chromium, and oxygen.

Example 16 comprises the apparatus of any one of examples 4-13, wherein the first electrode and/or the second electrode comprises strontium, iron, and oxygen.

Example 17 comprises the apparatus of any one of examples 4-13, wherein the first electrode and/or the second electrode comprises sodium, tungsten, and oxygen.

Example 18 comprises the apparatus of any one of examples 4-13, wherein the first electrode and/or the second electrode comprises potassium, molybdenum, and oxygen.

Example 19 comprises the apparatus of any one of examples 4-13, wherein the first electrode and/or the second electrode comprises strontium, niobium, and oxygen.

Example 20 comprises the apparatus of any one of examples 4-13, wherein the first electrode and/or the second electrode comprises lanthanum, titanium, and oxygen.

Example 21 comprises the apparatus of any one of examples 4-13, wherein the first electrode and/or the second electrode comprises lanthanum, tungsten, and oxygen.

Example 22 comprises the apparatus of any one of examples 4-13, wherein the first electrode and/or the second electrode comprises strontium, ruthenium, and oxygen.

Example 23 comprises the apparatus of any one of examples 4-13, wherein the first electrode and/or the second electrode comprises niobium, strontium, titanium, and oxygen.

Example 24 comprises the apparatus of any one of examples 4-13, wherein the first electrode and/or the second electrode comprises lanthanum, strontium, manganese, and oxygen.

Example 25 comprises the apparatus of any one of examples 1-24, wherein the ferroelectric insulating layer comprises tungsten and oxygen.

Example 26 comprises the apparatus of any one of examples 1-25, wherein the first electrode and/or the second electrode comprises ruthenium and oxygen.

Example 27 comprises the apparatus of any one of examples 1-26, wherein the first electrode is substantially planar, the second electrode is substantially planar, and the ferroelectric insulating layer is substantially planar.

Example 28 comprises the apparatus of any one of examples 1-26, wherein the first electrode is substantially non-planar, the second electrode is substantially non-planar, and the ferroelectric insulating layer are substantially non-planar.

Example 29 comprises the apparatus of any one of examples 1-26, wherein individual of the first electrode, the second electrode, the ferroelectric insulating layer, and the conductive layer comprise a first sidewall portion, a second sidewall portion, and a bottom portion, the first sidewall portions and the second sidewall portions substantially perpendicular to the bottom portion.

Example 30 comprises the apparatus of any one of examples 1-26, wherein individual of the first electrode, the second electrode, the ferroelectric insulating layer, and the conductive layer comprise a first sidewall portion, a second sidewall portion, and a bottom portion; the first sidewall portion of the second electrode, the second sidewall portion of the second electrode, and the bottom portion of the second electrode defining a volume substantially filled by one or more metals.

Example 31 comprises the apparatus of any one of examples 1-30, wherein the ferroelectric insulating layer has a thickness in a range of about 5-40 nm.

Example 32 is an apparatus comprising: a capacitor comprising: a first electrode; a second electrode; and a ferroelectric insulating layer positioned between the first electrode and the second electrode, wherein the ferroelectric insulating layer comprises: tin and sulfur; tin and selenium; germanium and sulfur; or germanium and selenium.

Example 33 comprises the apparatus of example 32, wherein the first electrode and/or the second electrode comprises: ruthenium; palladium; graphene; aluminum; copper; tungsten; or titanium and nitrogen.

Example 34 comprises the apparatus of example 32 or 33, wherein the first electrode is substantially planar, the second electrode is substantially planar, and the ferroelectric insulating layer is substantially planar.

Example 35 comprises the apparatus of example 32 or 33, wherein the first electrode is substantially non-planar, the second electrode is substantially non-planar, and the ferroelectric insulating layer are substantially non-planar.

Example 36 comprises the apparatus of example 32 or 33, wherein individual of the first electrode, the second electrode, and the ferroelectric insulating layer, comprise a first sidewall portion, a second sidewall portion, and a bottom portion, the first sidewall portions and the second sidewall portions substantially perpendicular to the bottom portion.

Example 37 comprises the apparatus of example 32 or 33, wherein individual of the first electrode, the second electrode, and the ferroelectric insulating layer comprise a first sidewall portion, a second sidewall portion, and a bottom portion; the first sidewall portion of the second electrode, the second sidewall portion of the second electrode, and the bottom portion of the second electrode defining a volume defining a volume substantially filled by one or more metals.

Example 38 comprises the apparatus of any one of examples 32-37, wherein the ferroelectric insulating layer has a thickness in a range of about 1-45 nm.

Example 39 comprises the apparatus of any one of examples 1-38, further comprising a conductive trace positioned adjacent to the second electrode, the conductive trace comprising: a metal; or titanium and nitrogen.

Example 40 comprises the apparatus of any one of examples 1-38, further comprising: a first conductive trace; and a second conductive trace, wherein the capacitor is positioned between the first conductive trace and the second conductive trace, individual of the first conductive trace and the second conductive trace comprising: a metal; or titanium and nitrogen.

Example 41 comprises the apparatus any one of examples 1-38, wherein the apparatus is located on a substrate.

Example 42 comprises the apparatus of any one of examples 1-38, wherein the apparatus is a processor unit.

Example 43 comprises the apparatus of any one of examples 1-38, wherein the apparatus is an integrated circuit component.

Example 44 comprises the apparatus of any one of examples 1-38, wherein the apparatus further comprises one or more transistors.

Example 45 comprises the apparatus of any one of examples 1-38, wherein the apparatus further comprises: a printed circuit board; and a first integrated circuit component attached to the printed circuit board, the first integrated circuit component comprising the first electrode, the second electrode, and the ferroelectric insulating layer.

Example 46 comprises the apparatus of example 45, wherein the apparatus further comprises one or more second integrated circuit components attached to the printed circuit board.

Example 47 comprises the apparatus of example 45, wherein the apparatus further comprises a housing enclosing the printed circuit board and the first integrated circuit component.

Example 48 is a method, comprising: forming a conductive layer on an integrated circuit structure; forming a first electrode positioned adjacent to the conductive layer; forming a ferroelectric insulating layer positioned adjacent to the first electrode; and forming a second electrode positioned adjacent to the ferroelectric insulating layer, wherein the first electrode comprises a ferroelectric oxide, the second electrode comprises a ferroelectric oxide, and the ferroelectric insulating layer comprises a ferroelectric oxide.

Example 49 comprises the method of example 48, further comprising forming a conductive trace prior to forming the conductive layer, the conducting layer positioned between the conductive trace and the first electrode.

Example 50 comprises the method of example 48, further comprising forming a seed layer prior to forming the conductive layer, the conducting layer positioned between the conductive trace and the first electrode.

Example 51 comprises the method of example 48, further comprising forming a conductive trace, the second electrode positioned between the conductive trace and the ferroelectric insulating layer.

Example 52 comprises the method of any one of examples 48-51, further comprising forming a dielectric layer positioned adjacent to the conductive layer, the dielectric layer comprising: silicon and oxygen; silicon, oxygen, and carbon; silicon, oxygen, and fluorine; silicon, oxygen, and hydrogen; or silicon and nitrogen.

Example 53 comprises the method of any one of examples 48-52, wherein the first electrode comprises a perovskite ferroelectric oxide, the second electrode comprises a perovskite ferroelectric oxide, and the ferroelectric insulating layer comprises a perovskite ferroelectric oxide.

Example 54 comprises the method of example 53, wherein the ferroelectric insulating layer comprises barium, titanium, and oxygen.

Example 55 comprises the method of example 53, wherein the ferroelectric insulating layer comprises: bismuth, iron, and oxygen; bismuth, iron, oxygen, and samarium; or bismuth, iron, oxygen, and lanthanum.

Example 56 comprises the method of example 53, wherein the ferroelectric insulating layer comprises lead, zirconium, titanium, and oxygen.

Example 57 comprises the method of example 53, wherein the ferroelectric insulating layer comprises lithium, tantalum, and oxygen.

Example 58 comprises the method of example 53, wherein the ferroelectric insulating layer comprises lithium, niobium, and oxygen.

Example 59 comprises the method of example 53, wherein the ferroelectric insulating layer comprises sodium, tantalum, and oxygen.

Example 60 comprises the method of example 53, wherein the ferroelectric insulating layer comprises strontium, titanium, and oxygen.

Example 61 comprises the method of example 53, wherein the ferroelectric insulating layer comprises potassium, tantalum, and oxygen.

Example 62 comprises the method of example 53, wherein the ferroelectric insulating layer comprises barium, strontium, titanium, and oxygen.

Example 63 comprises the method of any one of examples 53-62, wherein the first electrode and/or the second electrode comprises strontium, vanadium, and oxygen.

Example 64 comprises the method of any one of examples 53-62, wherein the first electrode and/or the second electrode comprise strontium, chromium, and oxygen.

Example 65 comprises the method of any one of examples 53-62, wherein the first electrode and/or the second electrode comprise strontium, iron, and oxygen.

Example 66 comprises the method of any one of examples 53-62, wherein the first electrode and/or the second electrode comprises sodium, tungsten, and oxygen.

Example 67 comprises the method of any one of examples 53-62, wherein the first electrode and/or the second electrode comprises potassium, molybdenum, and oxygen.

Example 68 comprises the method of any one of examples 53-62, wherein the first electrode and/or the second electrode comprises strontium, niobium, and oxygen.

Example 69 comprises the method of any one of examples 53-62 wherein the first electrode and/or the second electrode comprises lanthanum, titanium, and oxygen.

Example 70 comprises the method of any one of examples 53-62, wherein the first electrode and/or the second electrode comprises lanthanum, tungsten, and oxygen.

Example 71 comprises the method of any one of examples 53-62, wherein the first electrode and/or the second electrode comprises strontium, ruthenium, and oxygen.

Example 72 comprises the method of any one of examples 53-62, wherein the first electrode and second electrode comprises niobium, strontium, titanium, and oxygen.

Example 73 comprises the method of any one of examples 53-62, wherein the first electrode and second electrode comprises lanthanum, strontium, manganese, and oxygen.

Example 74 comprises the method of any one of examples 48-73, wherein the ferroelectric insulating layer comprises tungsten and oxygen.

Example 75 comprises the method of any one of examples 48-74, wherein the first electrode and/or the second electrode comprises ruthenium and oxygen.

Example 76 comprises the method of any one of examples 48-75, wherein the first electrode is substantially planar, the second electrode is substantially planar, and the ferroelectric insulating layer is substantially planar.

Example 77 comprises the method of any one of examples 48-75, wherein the first electrode is substantially non-planar, the second electrode is substantially non-planar, and the ferroelectric insulating layer are substantially non-planar.

Example 78 comprises the method of any one of examples 48-75, wherein individual of the first electrode, the second electrode, the ferroelectric insulating layer, and the conductive layer comprise a first sidewall portion, a second sidewall portion, and a bottom portion, the first sidewall portions and the second sidewall portions substantially perpendicular to the bottom portion.

Example 79 comprises the method of any one of examples 48-75, wherein individual of the first electrode, the second electrode, the ferroelectric insulating layer, and the conductive layer comprise a first sidewall portion, a second sidewall portion, and a bottom portion; first sidewall portion of the second electrode, the second sidewall portion of the second electrode, and the bottom portion of the second electrode defining a volume, the method further comprising forming a via that substantially fills the volume, the via comprising one or more metals.

Example 80 comprises the method of any one of examples 48-79, wherein the ferroelectric insulating layer has a thickness in a range of about 5-40 nm.

Example 81 is a method comprising: forming a first electrode on an integrated circuit structure; forming a ferroelectric insulating layer positioned adjacent to the first electrode; and forming a second electrode positioned adjacent to the ferroelectric insulating layer, wherein the ferroelectric insulating layer comprises: tin and sulfur; tin and selenium; germanium and sulfur; or germanium and selenium.

Example 82 comprises the method of example 81, wherein the first electrode and/or the second electrode comprises: ruthenium; palladium; graphene; aluminum; copper; tungsten; or titanium and nitrogen.

Example 83 comprises the method of example 81 or 82, wherein the first electrode is substantially planar, the second electrode is substantially planar, and the ferroelectric insulating layer is substantially planar.

Example 84 comprises the method of example 81 or 82, wherein the first electrode is substantially non-planar, the second electrode is substantially non-planar, and the ferroelectric insulating layer are substantially non-plana.

Example 85 comprises the method of example 81 or 82, wherein individual of the first electrode, the second electrode, and the ferroelectric insulating layer comprise a first sidewall portion, a second sidewall portion, and a bottom portion, the first sidewall portions and the second sidewall portions substantially perpendicular to the bottom portion.

Example 86 comprises the method of example 81 or 82, wherein individual of the first electrode, the second electrode, and the ferroelectric insulating layer comprise a first sidewall portion, a second sidewall portion, and a bottom portion; the first sidewall portion of the second electrode, the second sidewall portion of the second electrode, and the bottom portion of the second electrode defining a volume, the method further comprising forming a via that substantially fills the volume, the via comprising one or more metals.

Example 87 comprises the method of any one of examples 81-86, wherein the ferroelectric insulating layer has a thickness in a range of about 1-45 nm.

Example 88 comprises the method of any one of examples 81-87, wherein the integrated circuit structure comprises a die substrate.

The invention claimed is:

1. An apparatus comprising:

a capacitor comprising:

a first electrode;

a second electrode; and a ferroelectric insulating layer positioned between the first electrode and the second electrode, wherein the first electrode comprises a ferroelectric oxide, the second electrode comprises a ferroelectric oxide, and the ferroelectric insulating layer comprises a ferroelectric oxide including tungsten and oxygen; and a conductive layer positioned adjacent to the first electrode, the conductive layer comprising:

tantalum;

ruthenium;

titanium;

titanium and nitrogen;

iridium; or iridium and oxygen.

2. The apparatus of claim 1, wherein the first electrode comprises a perovskite ferroelectric oxide, the second electrode comprises a perovskite ferroelectric oxide, and the ferroelectric insulating layer comprises a perovskite ferroelectric oxide.

3. The apparatus of claim 2, wherein the ferroelectric insulating layer comprises barium, titanium, and oxygen.

4. The apparatus of claim 2, wherein the ferroelectric insulating layer comprises:

bismuth, iron, and oxygen;

bismuth, iron, oxygen, and samarium; or bismuth, iron, oxygen, and lanthanum.

5. The apparatus of claim 2, wherein the ferroelectric insulating layer comprises:

lead, zirconium, titanium, and oxygen;

lithium, tantalum, and oxygen;

lithium, niobium, and oxygen;

sodium, tantalum, and oxygen;

strontium, titanium, and oxygen;

potassium, tantalum, and oxygen; or barium, strontium, titanium, and oxygen.

6. The apparatus of claim 2, wherein the first electrode and/or the second electrode comprises:

strontium, vanadium, and oxygen;

strontium, chromium, and oxygen;

strontium, iron, and oxygen;

sodium, tungsten, and oxygen;

potassium, molybdenum, and oxygen; or strontium, niobium, and oxygen.

7. The apparatus of claim 2, wherein the first electrode and/or the second electrode comprises:

lanthanum, titanium, and oxygen;

lanthanum, tungsten, and oxygen;

strontium, ruthenium, and oxygen;

niobium, strontium, titanium, and oxygen; or comprises lanthanum, strontium, manganese, and oxygen.

8. The apparatus of claim 1, wherein the first electrode and/or the second electrode comprises ruthenium and oxygen.

9. The apparatus of claim 1, wherein the first electrode is substantially planar, the second electrode is substantially planar, and the ferroelectric insulating layer is substantially planar.

10. The apparatus of claim 1, wherein the first electrode is substantially non-planar, the second electrode is substantially non-planar, and the ferroelectric insulating layer are substantially non-planar.

11. The apparatus of claim 1, wherein individual of the first electrode, the second electrode, the ferroelectric insulating layer, and the conductive layer comprise a first sidewall portion, a second sidewall portion, and a bottom portion; the first sidewall portion of the second electrode, the second sidewall portion of the second electrode, and the bottom portion of the second electrode defining a volume substantially filled by one or more metals.

12. The apparatus of claim 1, wherein the ferroelectric insulating layer has a thickness in a range of about 5-40 nm.

13. The apparatus of claim 1, wherein the apparatus is an integrated circuit component.

14. The apparatus of claim 1, wherein the apparatus comprises:

a printed circuit board;

a first integrated circuit component attached to the printed circuit board, the first integrated circuit component comprising the first electrode, the second electrode, and the ferroelectric insulating layer; and one or more second integrated circuit components attached to the printed circuit board.

15. An apparatus comprising:

a capacitor comprising:

a first electrode comprising a ferroelectric oxide;

a second electrode comprising a ferroelectric oxide; and a ferroelectric insulating layer comprising a ferroelectric oxide and positioned between the first electrode and the second electrode, wherein the ferroelectric insulating layer comprises tungsten and oxygen.

16. The apparatus of claim 15, wherein the first electrode and/or the second electrode comprises:

ruthenium;

palladium;

graphene;

aluminum;

copper;

tungsten; or titanium and nitrogen.

17. The apparatus of claim 15, wherein the first electrode is substantially planar, the second electrode is substantially planar, and the ferroelectric insulating layer is substantially planar.

18. The apparatus of claim 15, wherein the first electrode is substantially non-planar, the second electrode is substantially non-planar, and the ferroelectric insulating layer is substantially non-planar.

19. The apparatus of claim 15, wherein individual of the first electrode, the second electrode, and the ferroelectric insulating layer, comprise a bottom portion, a first sidewall portion substantially perpendicular to the bottom portion, and a second sidewall portion substantially perpendicular to the bottom portion.

20. The apparatus of claim 15, wherein the ferroelectric insulating layer has a thickness in a range of about 1-45 nm.

21. The apparatus of claim 15, further comprising a conductive trace positioned adjacent to the second electrode, the conductive trace comprising:

a metal; or titanium and nitrogen.

22. The apparatus of claim 15, wherein the apparatus is an integrated circuit component.

23. The apparatus of claim 15, wherein the apparatus further comprises:

a printed circuit board;

a first integrated circuit component attached to the printed circuit board, the first integrated circuit component comprising the first electrode, the second electrode, and the ferroelectric insulating layer; and one or more second integrated circuit components attached to the printed circuit board.

24. An apparatus comprising:

a capacitor comprising:

a first electrode;

a second electrode; and a ferroelectric insulating layer positioned between the first electrode and the second electrode, wherein the first electrode comprises a perovskite oxide, the second electrode comprises a perovskite oxide, and the ferroelectric insulating layer comprises a ferroelectric oxide including tungsten and oxygen; and a conductive layer positioned adjacent to the first electrode, wherein individual of the first electrode, the second electrode, the ferroelectric insulating layer, and the conductive layer comprise a first sidewall portion, a second sidewall portion, and a bottom portion; the first sidewall portion of the second electrode, the second sidewall portion of the second electrode, and the bottom portion of the second electrode defining a volume substantially filled by one or more metals.

25. The apparatus of claim 24, wherein the ferroelectric insulating layer comprises a perovskite ferroelectric oxide.

* * * * *